United States Patent [19]
Zumoto et al.

[11] Patent Number: 5,684,642
[45] Date of Patent: Nov. 4, 1997

[54] OPTICAL TRANSMISSION SYSTEM AND LIGHT RADIATING METHOD

[75] Inventors: Nobuyuki Zumoto; Teruo Miyamoto; Toshinori Yagi; Masaaki Tanaka, all of Hyogo, Japan

[73] Assignee: Mitsubishi Denki Kabushiki Kaisha, Tokyo, Japan

[21] Appl. No.: 331,367

[22] Filed: Oct. 27, 1994

[30] Foreign Application Priority Data

Feb. 22, 1994 [JP] Japan ................. 6-024271

[51] Int. Cl.$^6$ ................................... G02B 9/00
[52] U.S. Cl. ................. 359/740; 359/739; 385/38
[58] Field of Search .................. 359/738, 739, 359/740, 362; 385/33, 38

[56] References Cited

U.S. PATENT DOCUMENTS

| | | | |
|---|---|---|---|
| 3,905,675 | 9/1975 | McCracken | 350/17 |
| 3,926,501 | 12/1975 | Hama | 350/96 B |
| 4,319,807 | 3/1982 | Horton | 350/6.4 |
| 4,626,563 | 12/1986 | Sciaky et al. | 219/121 LC |
| 4,746,193 | 5/1988 | Heritage et al. | 350/162.12 |
| 4,862,468 | 8/1989 | Fink | 342/19 |
| 5,068,515 | 11/1991 | van den Bergh et al. | 219/121.73 |
| 5,077,622 | 12/1991 | Lynch et al. | 359/813 |
| 5,148,323 | 9/1992 | Campbell et al. | 359/740 |
| 5,229,877 | 7/1993 | Hanada | 359/236 |
| 5,274,492 | 12/1993 | Razzaghi | 359/202 |

FOREIGN PATENT DOCUMENTS

| | | |
|---|---|---|
| 02244322 | 6/1987 | European Pat. Off. . |
| 0286165 | 10/1988 | European Pat. Off. . |
| 0315131 | 5/1989 | European Pat. Off. . |
| 2-55157 | 11/1990 | Japan . |
| 3-221287 | 9/1991 | Japan . |
| 5-138387 | 6/1993 | Japan . |
| 2137768 | 10/1984 | United Kingdom . |
| 2228099 | 8/1990 | United Kingdom . |
| 2229544 | 9/1990 | United Kingdom . |
| WO89/08277 | 9/1989 | WIPO . |

OTHER PUBLICATIONS

G. Sepold, "Impulsformig arbeitende Festkorperlaser fur das Schweiben von Metallen" in Schweiben und Schneiden, 1984, Iss 5, pp. 203–205.

U. Zoske, et al, "Optimierung Dear Strahlparameter im Fokus einer Bearbeitungsoptik", in: IPA–IAO Forschung und Praxis, vol. T11, 1988, Springer–Verlag Berlin, et al pp. 196–205.

*Primary Examiner*—Timothy P. Callahan
*Assistant Examiner*—Jung Ho Kim
*Attorney, Agent, or Firm*—Wolf, Greenfield & Sacks, P.C.

[57] ABSTRACT

An optical transmission system permitting any desired machining to be done by radiating to an object to be irradiated a laser beam having an optimum intensity distribution in the direction of its optical axis or in a plane perpendicular to the optical axis, comprising a laser oscillator 1, an optical fiber 3 for propagating the laser beam emitted from the laser oscillator 1 by a predetermined distance, a condenser lens 2 for converging the laser beam from the laser oscillator 1 into the optical fiber 3, a first lens 6 for forming images with aberration from the laser beam emerging from the optical fiber 3, a mask 7 disposed in a position having a predetermined light intensity distribution out of the positions of the images formed by the first lens 6, and a second lens 4 for forming the image passing through the mask 7 onto an object 5 to be irradiated.

7 Claims, 21 Drawing Sheets

θ = 0°     θ = 5°     θ = 10°

$M = \dfrac{b}{a}$ : MAGNIFICATION $$\begin{cases} z_2 = M^2 z_1 \\ M = \dfrac{f_2}{f_1} \end{cases}$$

$$\begin{cases} z_2 = M \cdot \dfrac{f_2}{f_1} \cdot z_1 \\ M = \dfrac{f_1 \cdot f_2}{z_1 \cdot \Delta d + f_1^2} \end{cases} \text{; MAGNIFICATION}$$

$$f_2 = \frac{f_A f_B}{f_A f_B - d_3} \rightarrow d_3 = f_A + f_B - \frac{f_A f_B}{f_2}$$

$$z_B = -\frac{d_3}{f_A} f_2$$

$$z_A = -\frac{d_3}{f_B} f_2$$

$$\begin{cases} d_3 = f_A + f_B - \dfrac{f_A f_B}{f} \\ z_B = -\dfrac{d_3}{f_A} f_2 \\ z_A = -\dfrac{d_3}{f_B} f_2 \end{cases}$$

OPTICAL TRANSMISSION SYSTEM AND LIGHT RADIATING METHOD

BACKGROUND OF THE INVENTION

1. Field of the Invention

The present invention relates to an optical transmission system for use in a laser machining equipment for machining such materials as metals, ceramics and resins, particularly an optical transmission for the transmission of laser beam to effect machining or surface treatment.

2. Description of the Prior Art

FIG. 1 illustrates a conventional optical transmission system disclosed in Japanese Patent Publication No. 55157/90 for example. In FIG. 1, the reference numeral 1 denotes a laser oscillator, numeral 2 denotes a condenser lens for converging the light beam emitted from the laser oscillator and directing the converged beam to a fiber 3, numeral 4 denotes an irradiation lens for radiating the light beam emerging from the fiber 3 to an object 5 to be irradiated, and numerals 11, 12, 13 and 16 each denote the laser beam. The focal length of the condenser lens 2 and that of the irradiation lens 4, as well as the positional relation of optical systems used, are optimized for efficient utilization of the laser energy.

Reference will now be made to the operation of the above conventional optical transmission system. The laser beam 11 emitted from the laser oscillator 1 is converged (laser beam 12) by the condenser lens 2 and is introduced into the optical fiber 3. The incident light beam emerges (laser beam 13) from the opposite end of the optical fiber 3 and the emerged light beam 13 is focused on the object 5 by the irradiation lens 4.

The conventional optical transmission system is constructed as above. The lenses used in the conventional optical systems are spherical lenses as shown in FIG. 1, and the laser beam which is transmitted is in axial symmetry with respect to its traveling direction. Therefore, the shape of the laser beam radiated onto the object to be irradiated is limited to the shape of a circular spot. Besides, for reducing the beam diameter to the smallest value there usually is adopted a construction wherein the beam distribution at the fiber output end is subjected to reduction transcription by the irradiation lens 4, so that the beam distribution radiated to the object is limited to a top-hat shape distribution, reflecting the intensity distribution, which is usually of a top-hat shape, at the fiber output end. According to a further problem involved in the conventional optical transmission system, the light beam still advancing from a focusing point is of a too large extent in the use of a focusing optical system including a single lens group, so when it is radiated to a workpiece, it is impossible to effect machining at a large focal depth.

SUMMARY OF THE INVENTION

The present invention has been accomplished in view of the above-mentioned problems and it is an object of the invention to provide an optical transmission system wherein a light beam having an optimum light intensity distribution in the optical axis direction or within a plane perpendicular to the optical axis, thereby making it possible to effect any desired machining.

It is another object of the present invention to provide an optical transmission system capable of forming an image on an object to be irradiated which image has a desired light intensity distribution in a direction perpendicular to the optical axis, thereby making it possible to effect a desired machining.

It is a further object of the present invention to provide an optical transmission system which permits various shapes of beams to be obtained easily by merely changing the distance between first and second lenses.

It is a still further object of the present invention to provide an optical transmission system capable of affording various shapes of machining beams according to mask shapes.

It is a still further object of the present invention to provide an optical transmission system capable of affording a circular shape of a machining beam and permitting radiation of a uniform light.

It is a still further object of the present invention to provide transmission system capable of affording a cylindrical shape of a machining beam and permitting uniform irradiation also in the case of a machining which is carried out by scanning a light beam.

It is a still further object of the present invention to provide an optical transmission system capable of affording various shapes of machining beams.

It is a still further object of the present invention to provide an optical transmission system capable of changing only the angle of incidence while maintaining a laser beam on the center of an optical fiber inlet.

It is a still further object of the present invention to provide an optical transmission system capable of changing the angle of incidence under easy control.

It is a still further object of the present invention to provide an optical transmission system capable of driving a laser beam at higher speed than the movement of an optical fiber inlet.

It is a still further object of the present invention to provide an optical transmission system of a simple construction.

It is a still further object of the present invention to provide an optical transmission system capable of changing the light intensity distribution at high speed.

It is a still further object of the present invention to provide an optical transmission system capable of realizing a more smooth and quick change in the light intensity distribution.

It is a still further object of the present invention to provide an optical transmission system capable of preventing the disturbance of the light intensity distribution caused by the boundary of substrate wedges at the time of changing the light intensity distribution.

It is a still further object of the present invention to provide an optical transmission system which is of a simple construction, wherein the number of drive elements is small and which can change the angle of incidence at high speed.

It is a still further object of the present invention to provide an optical transmission system capable of affording a machining beam superior in axial symmetry.

It is a still further object of the present invention to provide an optical transmission system capable of preventing the loss of energy in the use of a light shielding plate.

It is a still further object of the present invention to provide an optical transmission system capable of affording a light beam of an oblong shape or any other desired shape for radiation onto an object to be irradiated.

It is a still further object of the present invention to provide an optical transmission system capable of adjusting the light intensity distribution in the optical axis direction to give a large focal depth.

It is a still further object of the present invention to provide an optical transmission system capable of making the focal depth larger.

It is a still further object of the present invention to provide an optical transmission system capable of enlarging the distance between lens and an object to be irradiated and thereby reducing the fear of scatters from the object being deposited on the lens surface during machining which would cause deterioration in the transmittance of light.

It is a still further object of the present invention to provide an optical transmission system which permits the focal depth to be taken large even in the conventional construction of a like system.

It is a still further object of the present invention to provide a light radiation method which permits welding, cutting, marking, etc. to be done at a time in single operation and which can cope with different thicknesses and materials between areas.

It is a still further object of the present invention to provide a light radiation method which permits adjustment of the energy density for the material to be machined and which can thereby attain high-quality welding, cutting and piercing.

In order to achieve the above-mentioned objects, in the first aspect of the present invention there is provided an optical transmission system including an adjusting means for adjusting the light intensity distribution in the direction of an optical axis or in a plane perpendicular to the optical axis to a predetermined light intensity distribution in the vicinity of an object to be irradiated at the time of propagating a laser beam from a laser oscillator by a predetermined distance and radiating the propagated light onto the object to be irradiated.

According to the optical transmission system in the first aspect of the present invention, since the system includes means for adjusting the light intensity distribution in the direction of an optical axis or in a plane perpendicular to the optical axis to a predetermined light intensity distribution in the vicinity of an object to be irradiated, as mentioned above, it is possible to obtain a desired shape of a machining beam, adjust the focal depth to a desired depth and hence possible to effect a desired machining.

In the second aspect of the present invention there is provided an optical transmission system including an irradiation optical system and an adjusting means, the irradiation optical system and the adjusting means comprising a first lens which forms images with aberration and a second lens which forms on an object to be irradiated an image present in a position having a predetermined light intensity distribution from among the images formed by the first lens.

According to the optical transmission system in the second aspect of the present invention, since the system is provided with a first lens which forms images with aberration, as mentioned above, the images formed by the first lens have various light intensity distributions in the direction perpendicular to the optical axis. And since the second lens forms on an object to be irradiated an image present in a position having a predetermined intensity distribution from among those images, it is possible to form an image having a desired light intensity distribution on the object to be irradiated and hence possible to effect a desired machining.

In the third aspect of the present invention there is provided an optical transmission system including an adjusting mechanism capable of adjusting the distance between the first lens and the second lens.

According to the optical transmission system in the third aspect of the present invention, as mentioned above, the distance between the first and second lenses is changed by the adjusting mechanism, whereby an image having a desired light intensity distribution can be selected and formed on the object to be irradiated from among the images of various light intensity distributions, and thus various shapes of machining beams can be obtained easily by merely changing the above distance.

In the fourth aspect of the present invention there is provided an optical transmission system including a mask disposed in the imaging position by the first lens.

According to the optical transmission system in the fourth aspect of the present invention, as mentioned above, since a mask is disposed in the imaging position by the first lens and the light passing through the mask is focused on the object to be irradiated, various shapes of machining beams conforming to mask shapes can be obtained easily.

In the fifth aspect of the present invention there is provided an optical transmission system using the above mask, the mask being circular in shape, and wherein light passes through only the circular portion.

According to the optical transmission system in the fifth aspect of the present invention, since the mask shape is made circular as mentioned above, there is obtained a circular machining beam and so it is possible to effect uniform irradiation.

In the sixth aspect of the present invention there is provided an optical transmission system using the above mask, the mask being annular in shape, and wherein light passes through only the annular portion.

According to the optical transmission system in the sixth aspect of the present invention, since the mask is made annular as mentioned above, there is obtained an annular machining beam and so it is possible to effect uniform irradiation in the case of performing a machining while scanning a light beam.

In the seventh aspect of the present invention there is provided an optical transmission system including, in combination with the optical transmission system in the first aspect, a propagation optical system, the propagation optical system comprising an optical fiber and a condenser lens for converging a laser beam from a laser oscillator and introducing the converged beam into the optical fiber, an irradiation optical system constituted by a transfer optical system which transfers onto an object to be irradiated an image in a plane perpendicular to the optical axis and spaced a predetermined distance from the outlet end face of the optical fiber, and an adjusting means for adjusting the angle of incidence on the optical fiber of the laser beam converged by the condenser lens.

According to the optical transmission system in the seventh aspect of the present invention, as mentioned above, the propagation optical system is composed of an optical fiber and a condenser lens which converges the laser beam from the laser oscillator and introduces the converged beam into the optical fiber, the angle of incidence on the optical fiber of the laser beam converged by the condenser lens and the light intensity distribution in a plane perpendicular to the optical axis and spaced a predetermined distance from the outlet end face of the optical fiber are adjusted, and an image in the said plane is transferred onto the object to be irradiated, whereby there can be obtained various shapes of machining beams.

In the eighth aspect of the present invention there is provided an optical transmission system including the above adjusting means and wherein the adjustment by the adjusting means is realized by changing the angle of the inlet end face of the optical fiber while maintaining the said inlet end face in alignment with the optical axis.

According to the optical transmission system in the eighth aspect of the present invention, since the angle of the optical fiber inlet end face is changed while maintaining the said inlet end face in alignment with the optical axis, only the incidence angle can be changed while maintaining the laser beam on the center of the optical fiber inlet.

In the ninth aspect of the present invention there is provided an optical transmission system including the above adjusting means and wherein the adjustment made by the adjusting means is realized by moving a fixed optical system in a plane perpendicular to the optical axis in an aligned state of the optical axis of the condenser lens with that of the optical fiber, in a fixed state of the optical fiber inlet end face to the focal position of the condenser lens and with the optical axis of the laser beam from the laser oscillator held in parallel with the optical axis of the above fixed optical system.

According to the optical transmission system in the ninth aspect of the present invention, as mentioned above, since the fixed optical system is moved in a plane perpendicular to the optical axis in an aligned state of the optical axis of the condenser lens with that of the optical fiber, in a fixed state of the optical fiber inlet end face to the focal position of the condenser lens and with the optical axis of the laser beam from the laser oscillator held in parallel with the optical axis of the fixed optical system, the angle of incidence can be changed by an easy control.

In the tenth aspect of the present invention there is provided an optical transmission system including the above adjusting means and wherein the adjustment by the adjusting means is realized by shifting the laser beam from the laser oscillator in a plane perpendicular to the optical axis in a fixed state of the optical fiber inlet end face to the focal position of the condenser lens and with the optical axis of the laser beam held in parallel with the optical axis of the condenser lens.

According to the optical transmission system in the tenth aspect of the present invention, as mentioned above, since the laser beam from the laser oscillator is shifted in a plane perpendicular to the optical axis in a fixed state of the optical fiber inlet end face to the focal position of the condenser lens and with the optical axis of the laser beam held in parallel with the optical axis of the condenser lens, it is possible to effect a higher speed drive than movement of the optical fiber inlet.

In the eleventh aspect of the present invention there is provided an optical transmission system wherein a plane mirror whose angle to the optical axis can be changed and a wedge substrate are disposed between the laser oscillator and the condenser lens and the shifting of the laser beam in a plane perpendicular to the optical axis is performed by changing the angle of the plane mirror and at the same by replacing the wedge substrate with another wedge substrate having a different wedge angle.

According to the optical transmission system in the eleventh aspect of the present invention as mentioned above, since a plane mirror whose angle to the optical axis can be changed and a wedge substrate are disposed between the laser oscillator and the condenser lens and the shifting of the laser beam in a plane perpendicular to the optical axis is performed by replacing the wedge substrate with another wedge substrate different in wedge angle simultaneously with changing the plane mirror angle, it is possible to attain a simpler construction.

In the twelfth aspect of the present invention there is provided an optical transmission system wherein a plane mirror whose angle to the optical axis can be changed and a special wedge substrate having plural kinds of wedge angles are disposed between the laser oscillator and the condenser lens, and the shifting of the laser beam in a plane perpendicular to the optical axis is performed by changing the angle of the plane mirror.

According to the optical transmission system in the twelfth aspect of the present invention as mentioned above, since a plane mirror whose angle to the optical axis can be changed and a special wedge substrate having plural kinds wedge angles and the shifting of the laser beam in a plane perpendicular to the optical axis is performed by changing the angle of the plane mirror, it is possible to cause a high-speed change in the light intensity distribution.

In the thirteenth aspect of the present invention there is provided an optical transmission system wherein between the laser oscillator and the condenser lens are disposed a plane mirror whose angle to the optical axis can be changed and special disk-like wedge substrates having different wedge angles and arranged continuously in the circumferential direction, and the shifting of the laser beam in a plane perpendicular to the optical axis is performed by rotating the special substrates simultaneously with changing the angle of the plane mirror.

According to the optical transmission system in the thirteenth aspect of the present invention, as mentioned above, since a plane mirror whose angle to the optical axis can be changed and special disk-like wedge substrates having different wedge angles and arranged continuously in the circumferential direction are disposed between the laser oscillator and the condenser lens and the shifting of the laser beam in a plane perpendicular to the optical axis is performed by rotating the above special wedges simultaneously with changing the angle of the plane mirror, there can be realized a smoother and faster change in the light intensity distribution.

In the fourteenth aspect of the present invention there is provided an optical transmission system wherein between the laser oscillator and the condenser lens are disposed a plane mirror whose angle to the optical axis is changeable and a special substrate having a constant wedge angle in the radial direction and continuously varying wedge angles in the circumferential direction, and the shifting of the laser beam in a plane perpendicular to the optical axis is performed by rotating the special substrate simultaneously with changing the angle of the plane mirror.

According to the optical transmission system in the fourteenth aspect of the present invention, as mentioned above, since a plane mirror whose angle to the optical axis is changeable and a special substrate having a constant wedge angle in the radial direction and continuously varying wedge angles in the circumferential direction are disposed between the laser oscillator and the condenser lens and the shifting of the laser beam in plane perpendicular to the optical axis is performed by rotating the special substrate simultaneously with changing the angle of the plane mirror, it is possible to prevent the disturbance of the light intensity distribution caused by the boundary of substrate wedges.

In the fifteenth aspect of the present invention there is provided an optical transmission system wherein a parabolic mirror is disposed between the laser oscillator and the condenser lens, an angle changeable plane mirror is disposed in the focal position of the parabolic mirror, and the shifting of the laser beam in a plane perpendicular to the optical axis is performed by changing the angle of the plane mirror.

According to the optical transmission system in the fifteenth aspect of the present invention, as mentioned above, since a parabolic mirror is disposed between the laser oscillator and the condenser lens, an angle changeable plane mirror is disposed in the focal position of the parabolic mirror and the shifting of the laser beam in a plane perpendicular to the optical axis is performed by changing the angle of the plane mirror, it is possible to attain a simple construction, a reduced number of drive elements and a high-speed change of the incidence angle.

In the sixteenth aspect of the present invention there is provided an optical transmission system including the above adjusting means and wherein the adjustment by the adjusting means is realized by shaping the light intensity distribution of the laser beam incident on the condenser lens in a plane perpendicular to the optical axis into an annular form having desired inside and outside diameters.

According to the optical transmission system in the sixteenth aspect of the present invention, as mentioned above, since the light intensity distribution of the laser beam incident on the condenser lens in a plane perpendicular to the optical axis is shaped into an annular form having desired inside and outside diameters and the angle of incidence on the optical fiber is adjusted by changing the said diameters, the axial symmetry of the resulting machining beam is improved.

In the seventeenth aspect of the present invention there is provided an optical transmission system wherein two axicon lenses are disposed oppositely to each other between the laser oscillator and the condenser lens, and the shaping of the laser beam into an annular shape having desired inside and outside diameters is conducted by changing the spacing between the two axicon lenses.

According to the optical transmission system in the seventeenth aspect of the present invention as mentioned above, since the shaping of the laser beam into an annular shape having desired inside and outside diameters is conducted by changing the spacing between two axicon lenses disposed oppositely to each other between the laser oscillator and the condenser lens, it is possible to prevent the loss of energy in the use of a light shielding plate.

In the eighteenth aspect of the present invention there is provided an optical transmission system including the above adjusting means and wherein an elliptic mirror is disposed between the condenser lens and the inlet end face of the optical fiber, a plane mirror whose angle to the optical axis can be changed is disposed in a first focal position of the elliptic mirror, the inlet end face of the optical fiber is disposed in a second focal position of the elliptic mirror, and the adjustment by the adjusting means is realized by changing the angle of the plane mirror.

According to the optical transmission system in the eighteenth aspect of the present invention, as mentioned above, since an elliptic mirror is disposed between the condenser lens and the inlet end face of the optical fiber, a plane mirror whose angle to the optical axis can be changed is disposed in a first optical position of the elliptic mirror, the optical fiber inlet end face is disposed in a second focal position of the elliptic mirror and the angle of incidence on the optical fiber is adjusted by changing the angle of the plane mirror, it is possible to attain a simple construction, a reduced number of drive elements and a high-speed change of the incidence angle.

In the nineteenth aspect of the present invention there is provided an optical transmission system including an irradiation optical system, the irradiation optical system having a focusing optical system which comprises two groups of cylindrical lenses having radii of curvature in directions orthogonal to each other.

According to the optical transmission system in the nineteenth aspect of the present invention, since the irradiation optical system has a focusing optical system which comprises two groups of cylindrical lenses having radii of curvature in directions orthogonal to each other, the shape of the light beam to be radiated onto an object to be irradiated can be made into an oblong shape or any other desired shape by suitably selecting the focal length of each lens.

In the twentieth aspect of the present invent/on there is provided an optical transmission system including an irradiation optical system, the irradiation optical system having a focusing optical system comprising two lens groups, and wherein when the distance from a second principal plane of the first lens group to a first principal plane of the second lens group is d, the focal length of the first lens group is $f_1$, the focal length of the second lens group is $f_2$, the distance from a predetermined position of propagated light to an object-side focal position of the first lens group is $z_1$ and the distance from an image-side focal position of the second lens group to the object to be irradiated is $z_2$, the following conditions are satisfied:

$$d = f_1 + f_2 + \Delta d$$

$$z_1 = f_1 f_2 z_2 / (z_1 \Delta d + f_1^2)$$

According to the optical transmission system in the twentieth aspect of the present invention, as mentioned above, since the focusing optical system in the irradiation optical system comprises two lens groups and is constituted in such a manner that when the distance from a second principal plane of the first lens group to a first principal plane of the second lens group is d, the focal lengths of the first and second lens groups are $f_1$ and $f_2$, respectively, the distance from a predetermined position of propagated light to an object-side focal position of the first lens group is $z_1$ and the distance from an image-side focal position of the second lens group to the object to be irradiated is $z_2$, the following conditions are satisfied:

$$d = f_1 + f_2 + \Delta d$$

$$z_1 = f_1 f_2 z_2 / (z_1 \Delta d - f_1^2)$$

it is possible to adjust the light intensity distribution in the optical axis direction and hence the light beam is radiated nearly perpendicularly to the object to be irradiated, so that the convergibility of the beam energy is improved and there is obtained a large focal depth.

In the twenty-first aspect of the present invention there is provided an optical transmission system including the above focusing optical system and wherein the focusing optical system further satisfies the following conditions:

$$-f_1^2/(f_2 + \Delta d) < z_1 < f_1$$

$$f_1 > 0, f_2 > 0$$

$$\Delta d > 0$$

According to the optical transmission system in the twenty-first aspect of the present invention, since the focusing optical system further satisfies the following conditions as mentioned above:

$-f_1^2/(f_2+\Delta d) < z_1 < f_1$ $f_1 > 0, f_2 > 0$ $\Delta d > 0$ it is possible to make the focal depth larger.

In the twenty-second aspect of the present invention there is provided an optical transmission system including the above focusing optical system and wherein the second lens group is a set of concave lens and convex lens, and when the focal length of the compound lens is $f_2$, the focal length of the concave lens 403 is $f_A$, the focal length of the convex lens 404 is $f_B$, the distance between a second principal plane of the concave lens and a first principal plane of the convex lens is $d_3$, the length between a first principal plane of the concave lens and a first principal plane of the compound lens is $z_A$ and the distance between a second principal plane of the convex lens and a second principal plane of the compound lens is $z_B$, the following conditions are satisfied:

$f_2 = f_A f_B/(f_A + f_B - d_3)$ $z_B = -d_3 f_2/f_A$ ($Z_B$, when positive value, rightward)

$z_A = -d_3 f_2/f_B$ ($Z_A$, when negative value, rightward)

According to the optical transmission system in the twenty-second aspect of the present invention, as mentioned above, since the second lens group is composed of a set of concave and convex lenses and when the focal length of the compound lens is $f_2$, the focal lengths of the concave and convex lenses 403, 404 are $f_A$ and $f_B$, respectively, the distance between a second principal plane of the concave lens and a first principal plane of the convex lens is $d_3$, the distance between a first principal plane of the concave lens and a first principal plane of the compound lens is $z_A$ and the distance between a second principal plane of the convex lens and a second principal plane of the compound lens is $z_B$, the following conditions are satisfied:

$f_2 = f_A f_B/(f_A + f_B - d_3)$ $z_B = -d_3 f_2/f_A$ ($Z_B$, when positive value, rightward)

$Z_A = -d_3 f_2/f_B$ ($Z_A$, when negative value, rightward)

the second principal plane of the compound lens can be positioned on the object side and therefore the distance between the lenses and the object to be irradiated can be made larger in comparison with the use of a single lens of focal length $f_2$.

In the twenty-third aspect of the present invention there is provided an optical transmission system in combination with the above optical transmission system wherein the predetermined position of propagated light corresponds to the outlet end face of the optical fiber.

According to the optical transmission system in the twenty-third aspect of the present invention, as mentioned above, since the outlet end face of the optical fiber is used as the predetermined position of propagated light, it is possible to take the focal depth large not only in the optical transmission system wherein the light intensity distribution in the direction perpendicular to the optical axis is adjusted but also in the conventional construction of an optical transmission system.

In the twenty-fourth aspect of the present invention there is provided a light radiating method which changes the light intensity distribution of irradiation light for each certain area of an object to be irradiated at the time of radiating a laser beam to the object using any of the above optical transmission systems.

According to the light radiating method in the twenty-fourth aspect of the present invention, as mentioned above, since the light intensity distribution of irradiation light is changed for each certain area of an object to be irradiated at the time of radiating a laser beam to the object using any of the above optical transmission systems, it is possible to effect welding, cutting, marking, etc. at a time in a single operation, and it is also possible to cope with the case where thickness and the quality of material are different between areas.

In the twenty-fifth aspect of the present invention there is provided a light radiating method wherein a laser oscillator of a pulse oscillation type is used as the laser oscillator in any of the foregoing optical transmission system, and the light intensity distribution is changed in one pulse of the laser beam at the time of radiating the laser beam to an object to be irradiated, the said change in one pulse being repeated for each pulse.

According to the light radiating method in the twenty-fifth aspect of the present invention, as mentioned above, since the light intensity distribution in one pulse of the laser beam from a pulse oscillation type laser oscillator in any of the foregoing optical transmission system is changed at the time of radiation of the laser beam to an object to be irradiated and the said change in one pulse is repeated for each pulse, the energy density for the material can be made changeable, thereby making it possible to effect welding, cutting and piercing to a satisfactory extent in point of quality.

The above and other objects and novel features of the present invention will become apparent more fully from the following detailed description when the same is read in connection with the accompanying drawings. It is to be understood, however, that the drawings are for the purpose of illustration only and is not intended to limit the scope of the invention.

DETAILED DESCRIPTION OF THE PREFERRED EMBODIMENTS

Figure 1:
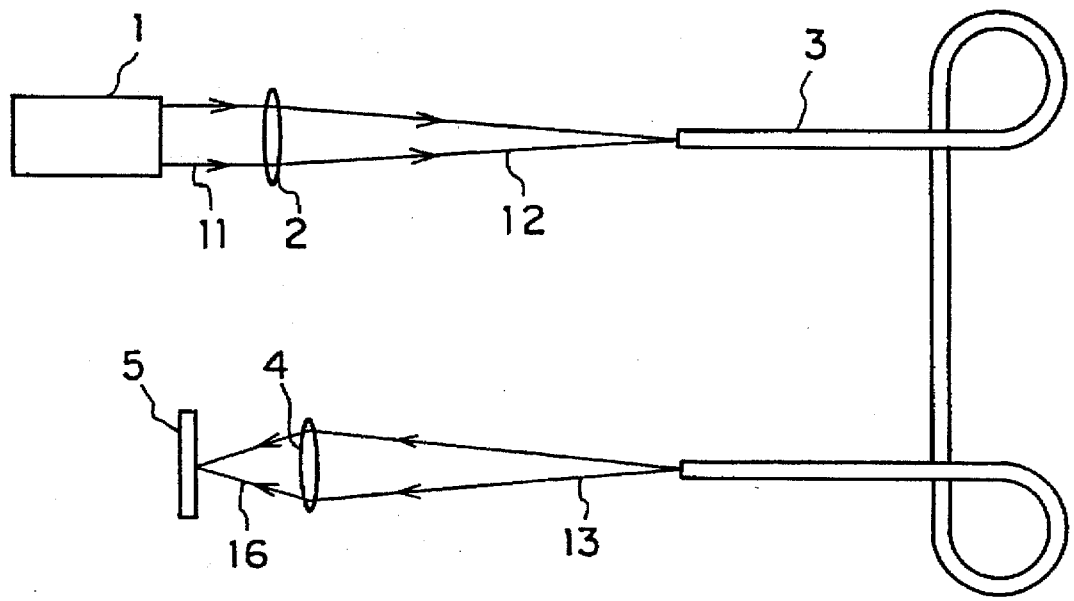
FIG. 1 is a construction diagram showing a conventional optical transmission system.

Preferred embodiments of the present invention will be described in detail hereinafter with reference to the accompanying drawings.

Embodiment 1

The first embodiment of the present invention will now be described with reference to FIG. 2. In the same figure, the reference numeral 1 denotes a laser oscillator. Laser beam 11 emitted from the laser oscillator 1 is introduced (laser beam 12) into an optical fiber 3 by means of a condenser lens 2 and emerges (laser beam 13) from the opposite end of the optical fiber 3. The outgoing laser beam 13 is focused (laser beam 14) near a mask 7 by means of a first lens 6 having a spherical aberration. Part of the resulting light intensity distribution is removed by the mask 7 and the light intensity distribution after the said removal is transferred onto an object 5 to be irradiated by means of a second lens 4 of high resolution. Numeral 15 denotes a laser beam after partial removal in the mask 7, and numeral 16 denotes an imaging beam for the object 5.

This embodiment will be described below in detail in accordance with an optical path of the optical system.

Figure 2:
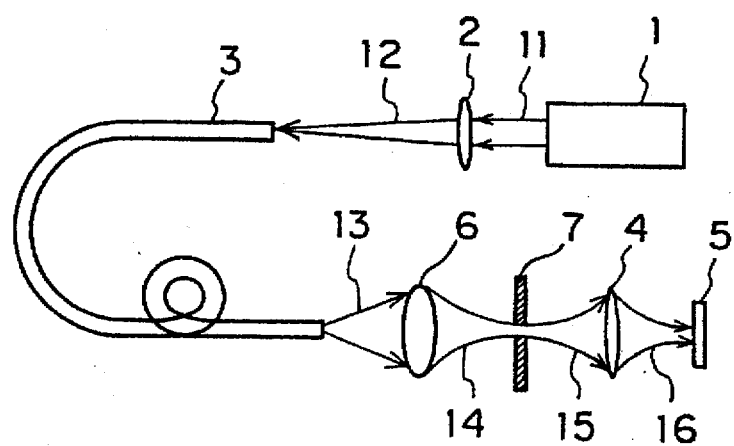
FIG. 2 is a construction diagram showing an optical transmission system according to embodiment 1 of the present invention.
Figure 3:
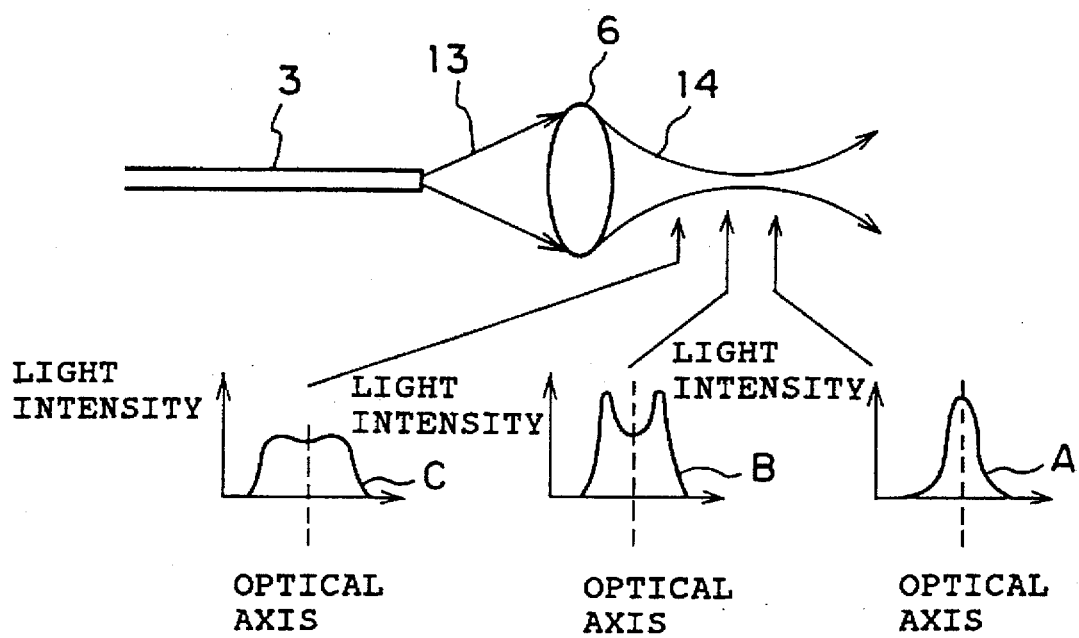
FIG. 3 is a diagram explaining the operation of a first lens used in embodiment 1.

In FIG. 2, as to the optical fiber 3, the radius of gyration of an intermediate bend is adjusted. As this radius of gyration is varied, the state of reflection in the interior of the optical fiber becomes complicated, giving rise to the effect of random superposition, whereby the coherency of the laser beam emerging from the optical fiber can be changed. In the case where the laser beam is propagated by means of plural reflecting mirrors or the like without using the optical fiber 3, the laser beam emitted from the laser oscillator 1 and having a high coherency will enter the lens 6 as it is. Since the first lens 6 has aberration, the focusing pattern of the laser beam 13 incident on the first lens 6 changes with respect to the optical axis direction in the vicinity of the focusing position, as shown in FIG. 3. More specifically, a change is made from shape A having a sharp peak to a ring-like shape B and top hat shape C.

Figure 4A:
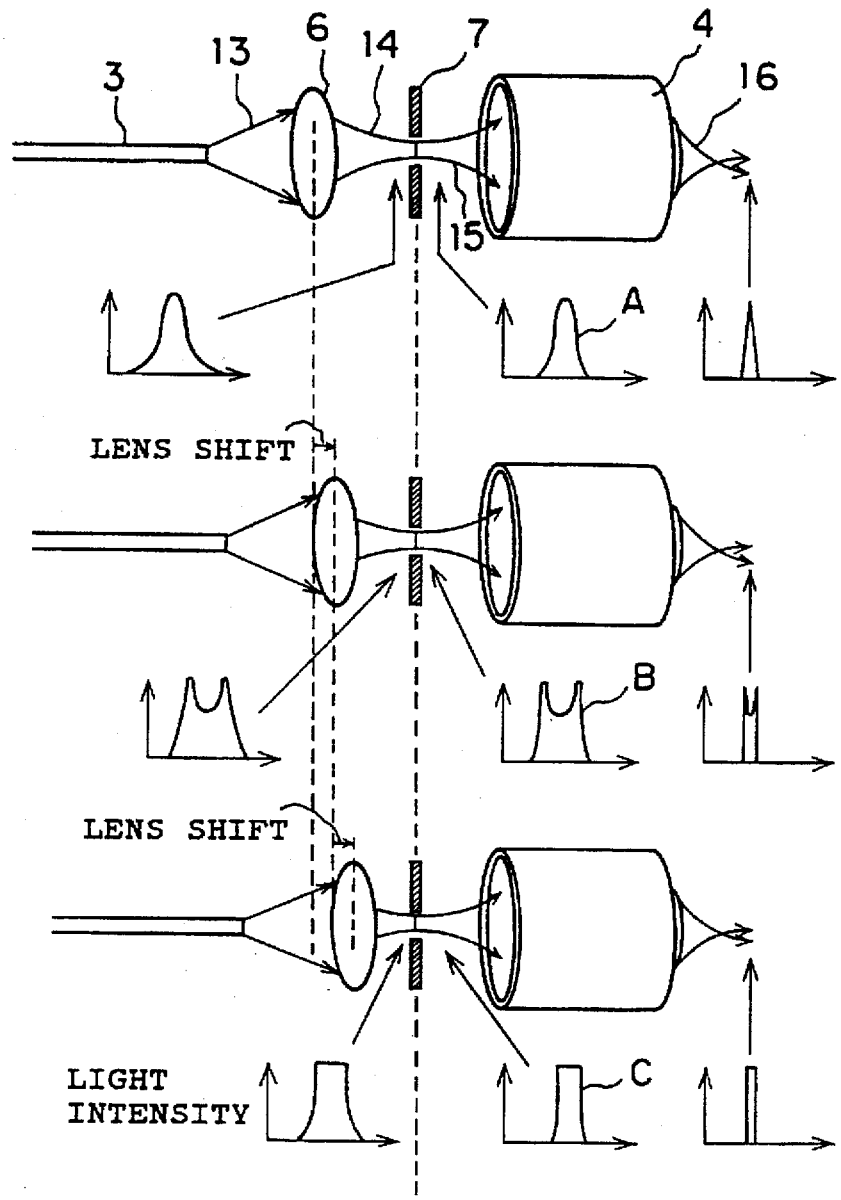
FIGS. 4(a) and 4(b) are diagrams explaining the operation of an optical transmission system according to embodiment 1.
Figure 4B:
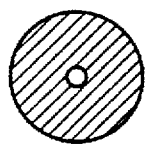

Now, with reference to FIGS. 4(a) and 4(b), the following description is provided about the case where the light intensity distribution which differs depending on defocusing of the first lens 6 is transferred onto the object 5 to be irradiated. In FIG. 4(a), the laser beam 13 incident on the lens 6 takes any of the peak shape A, ring shape B and top hat shape C in accordance with a defocusing position. For example, when a desired distribution shape to be radiated to the object is the shape of top hat, such a circular mask 7 as shown in FIG. 4(b) is placed in the defocusing position corresponding to the top hat shape C in order to cut the foot the beam distribution and shape the distribution into a desired form. Next, the beam distribution thus shaped by the mask 7 is transferred on a reduced scale onto the object by the second lens 4 to obtain a very small top hat-shaped distribution. Likewise, by changing the position of the first lens 6 or the position of the second lens 4 and mask 7 and by changing defocusing of the first lens 6, the final distribution shape obtained by the second lens 4 can be made into ring shape or peak shape.

In FIGS. 4(a) and 4(b), it is not always necessary to use the mask 7. A laser beam having a desired shape of a focusing pattern can be obtained by adjusting the distance between the first and second lenses 6, 4.

Figure 5A:
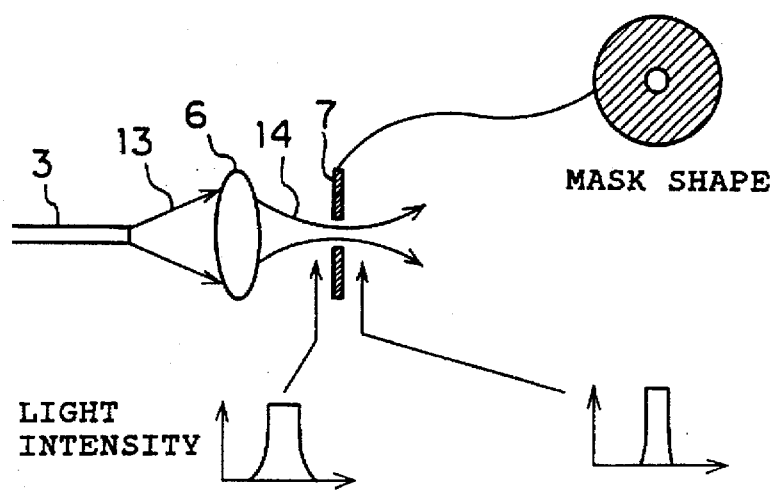
FIGS. 5(a) to 5(c) are diagrams explaining the operation of another optical transmission system according to embodiment 1.
Figure 5B:
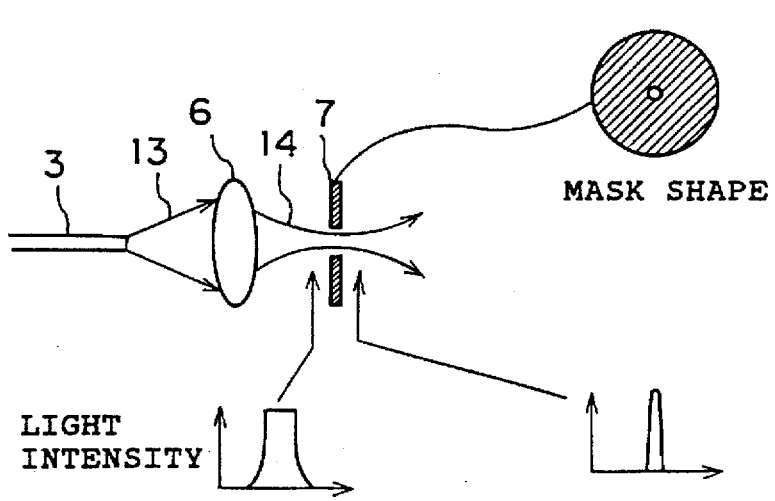
Figure 5C:
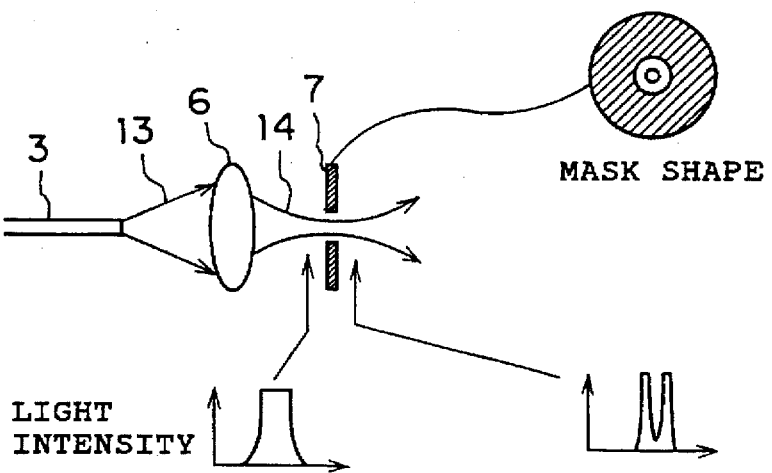

In each of FIGS. 5(a), 5(b) and 5(c), the mask 7 for shaping the foot portion of the beam distribution as in the previous case is placed in the position where the light intensity distribution obtained by the first lens 6 assumes the shape of top hat, and the light beam emerging from the mask 7 is transferred onto the object by means of the second lens. As the mask shape there may be adopted such a fine circular shape or ring shape as shown in FIGS. 5(b) and 5(c). In this case, although the loss of energy is larger than in FIG. 4, a fine spot beam or ring-like intensity distribution can be obtained easily by mere replacement of the mask 7 even without adjusting the lens-to-lens distance.

Although in the above embodiment there is used a lens having a spherical aberration as the first lens 6, there also may be used a lens having coma aberration or astigmatism for realizing various shapes of focusing patterns.

Embodiment 2

Another embodiment of the present invention will be described below with reference to the accompanying drawings.

In a conventional optical transmission system using an optical fiber as a propagation optical system, a light beam is incident in parallel with the optical axis of the optical fiber, while in this embodiment of the present invention a light beam is introduced at a certain angle to the optical axis of an optical fiber to control and change the shape of the light intensity distribution of the light beam emerging from the optical fiber into any of various shapes, including top hat shape and ring shape.

Figure 6:
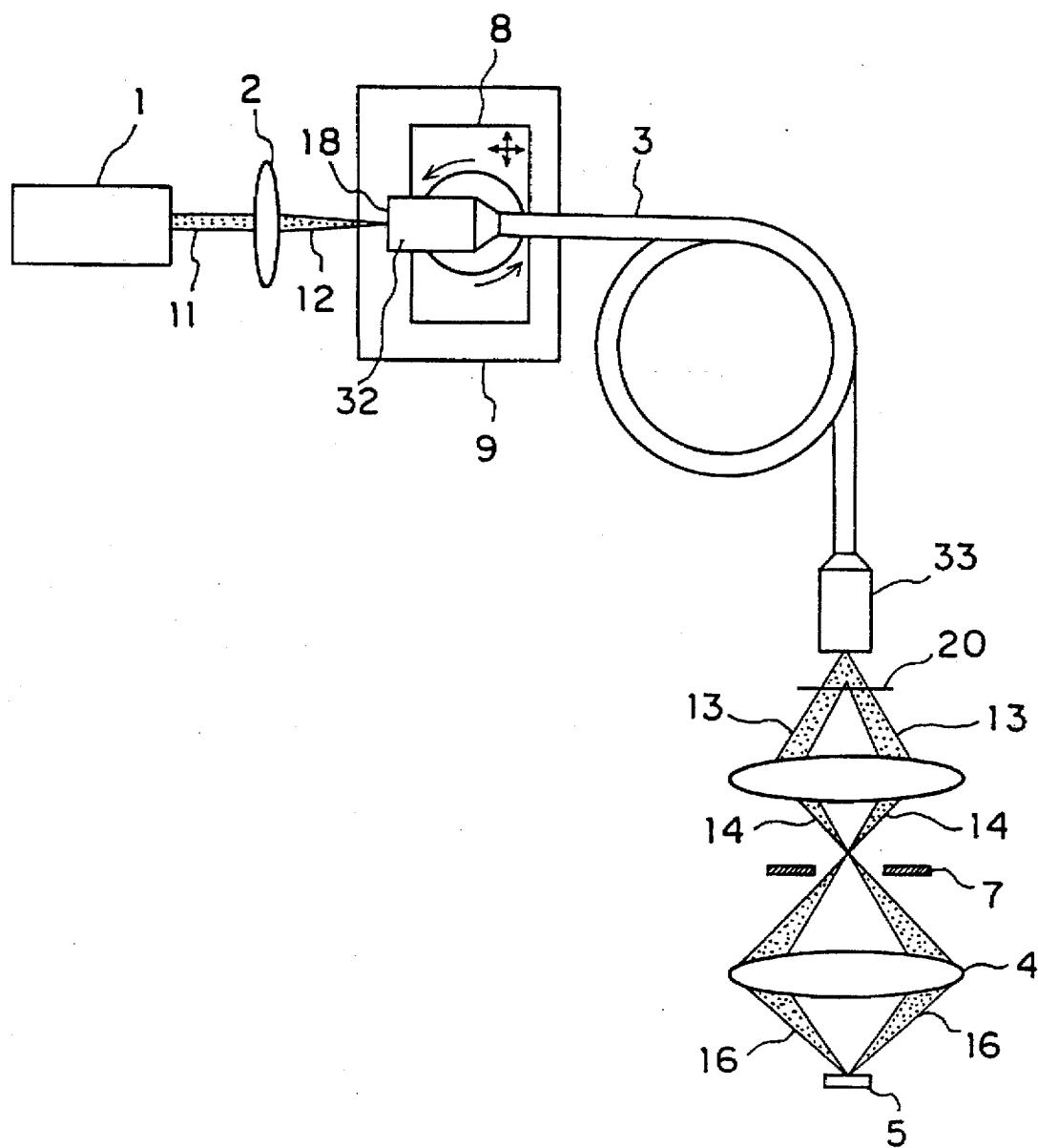
FIG. 6 is a construction diagram showing an optical transmission system according to embodiment 2 of the present invention.

FIG. 6 is a construction diagram of an optical transmission system according to this embodiment 2. In the same figure, the numeral 1 denotes a laser oscillator, numeral 2 denotes a condenser lens, numeral 3 denotes an optical fiber, numeral 9 denotes an incidence angle control mechanism comprising an inlet 32 of optical fiber 3 and an XYθ stage 8, and numeral 33 denotes an optical fiber outlet.

This embodiment will be described in detail below in accordance with an optical path of the optical system used therein.

Figure 7:
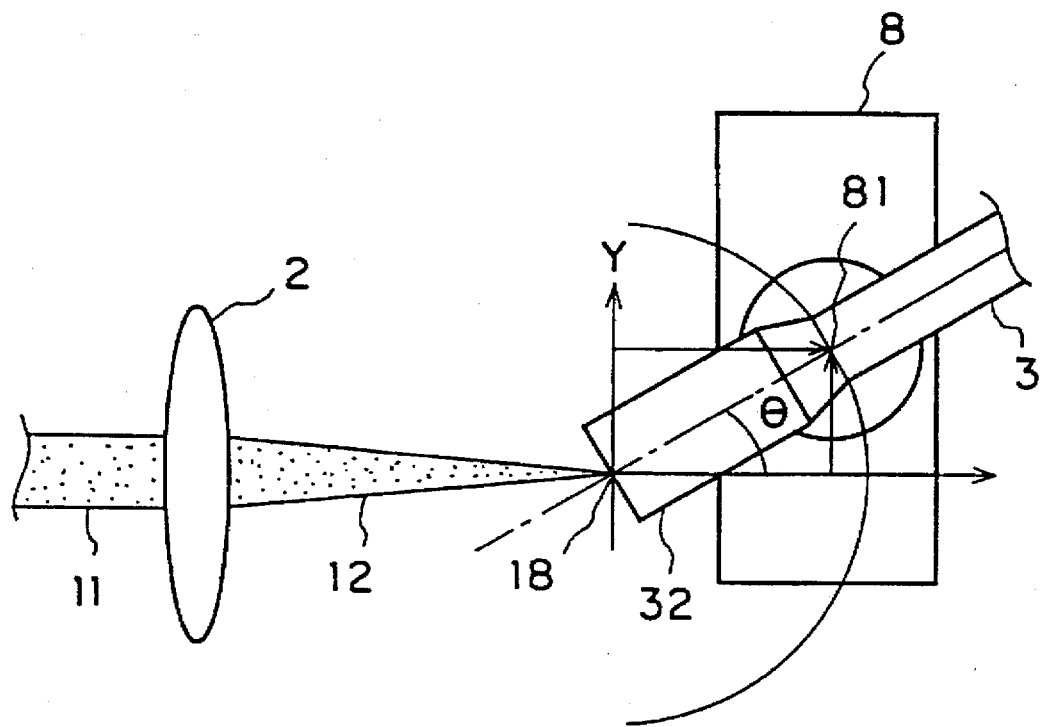
FIG. 7 is a diagram explaining the control of incidence angle in embodiment 2.

In FIG. 6, a laser beam 11 emitted from the laser oscillator 1 passes through the condenser lens 2 and is converged thereby (laser beam 12) to the inlet 32 of the optical fiber 3. The optical fiber inlet 32 is located in a focal position of the condenser lens 2. Further, the inlet 32 is connected to the XYθ stage 8, both constituting the incidence angle control mechanism 9. By the mechanism 9 there is made a control such that only the angle between an optical fiber end face and the optical axis is changed without deviation of the central position of the inlet 32 from a converged point 18 of the laser beam 12. FIG. 7 shows a moving locus of the XYθ stage 8. In the same figure, a connection point 81 of the XYθ stage 8 with the optical fiber inlet 32 moves while describing a locus represented by the following equations with respect to the converged point 18, as the origin, of the laser beam converged by the condenser lens 2:

$X(\theta) = R \times \cos \theta$ $Y(\theta) = R \times \sin \theta$ where R represents the distance between the center 18 of the inlet end and the center 81 of the connection between XYθ stage 8 and optical fiber 3, and θ represents an angle between the optical axis and the central axis of the optical fiber.

Thus, when the optical fiber 3 has an angle of incidence, the intensity distribution of the laser beam changes in a position 20 (hereinafter referred to as the "mode conversion plane") which is spaced a certain distance or longer from the outlet end face of the optical fiber. The results of an experiment conducted using helium-neon laser will be shown below.

Figure 8A:
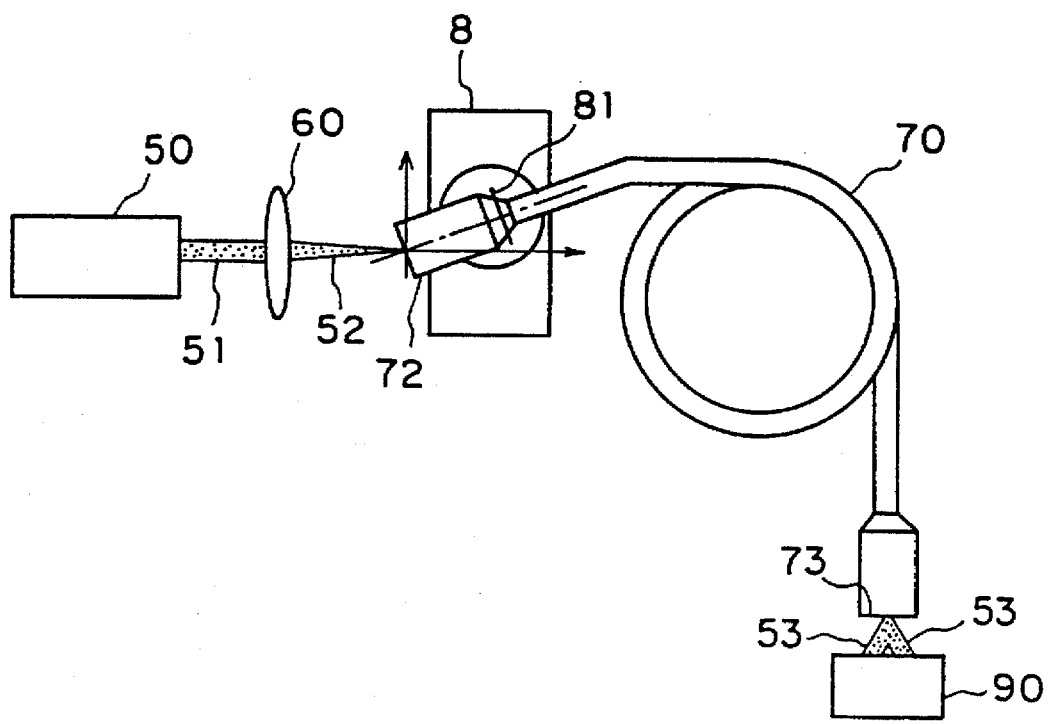
FIGS. 8(a) to 8(d) are explanatory diagrams showing a relation between the incidence angle of laser beam and the intensity distribution of outgoing, or transmitted, laser beam.

FIG. 8(a) is a construction diagram showing a laboratory apparatus. In the same figure, the numeral 50 denotes a helium-neon laser, numeral 60 denotes a plano-convex lens of 40 mm in focal length, numeral 8 denotes an XYθ stage, numeral 70 denotes a step index type optical fiber of 40 μm core, 5 m length, NA=0.2, and numeral 90 denotes a CCD camera.

Figures 8B, 8C, 8D:
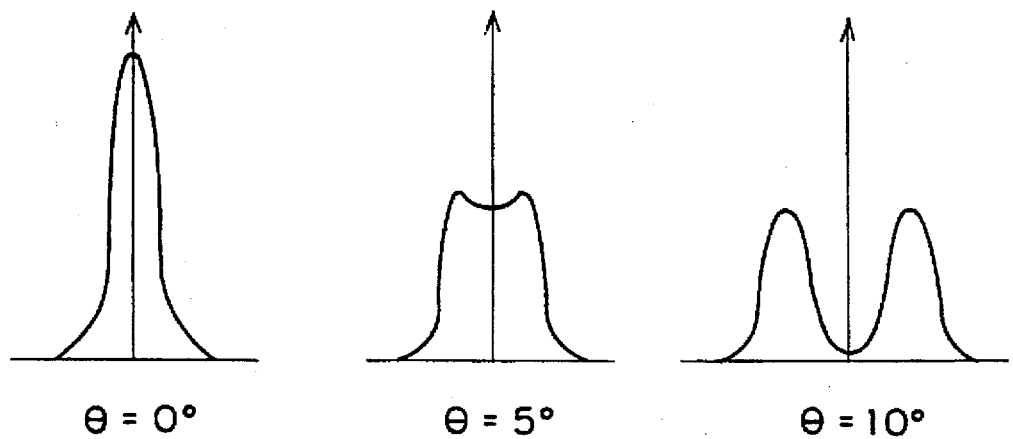

Laser beam 51 from the helium-neon laser was introduced (incident beam 52) in a converged state into an inlet end face 72 of the optical fiber 70 by means of the plano-convex lens 60 having a focal length of 40 mm, and the intensity distribution of an outgoing, or transmitted, beam 53 was measured using the CCD camera 90 in a position spaced about 20 mm from an outlet end face 73. The results obtained are as shown in FIGS. 8(b), 8(c) and 8(d). It is seen that as the angle of incidence is made larger little by little from 0° as shown FIG. 8(b) to the angle shown in FIG. 8(d), the intensity distribution of the laser beam changes in shape from a generally Gaussian shape to a generally rectangular shape and further to a generally annular shape. Thus, the intensity distribution of the outgoing laser beam can be controlled by changing the angle of incidence on the optical fiber.

In FIG. 6, the laser beam 13 emerging from the optical fiber 3 passes through the first lens 6, whereby the image having the light intensity distribution on the mode conversion plane 20 is formed near the mask 7. Part of the light intensity distribution formed is removed by the mask 7 and the light intensity distribution after the removal is transferred onto an object 5 to be irradiated by means of a second lens 4 of high resolution to effect machining or processing such as welding, cutting or surface modification.

Although in this embodiment the image having the light intensity distribution on the mode conversion plane 20 is once formed near the mask 7 by means of the first lens 6, part of the light intensity distribution formed is removed by the mask 7 and the light intensity distribution after the said removal is transferred onto the object 5 by means of the second lens 4 of high resolution, there may be used, as the irradiation optical system for radiating the propagated light beam onto the object 5, an optical system using a single lens for transferring the image of the light intensity distribution on the mode conversion plane 20 onto the object 5.

Embodiment 3

Still another embodiment of the present invention will be described below with reference to the accompanying drawings.

Figure 9:
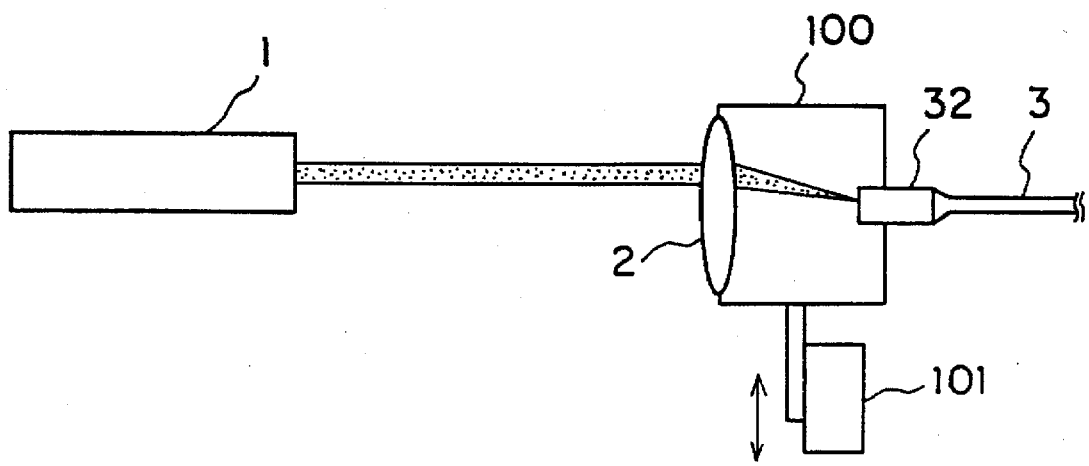
FIG. 9 is a construction diagram showing principal components of an optical transmission system according to embodiment 3 of the present invention.

In this embodiment there is used an incidence angle control mechanism of such a construction as shown in FIG. 9. In the same figure, the condenser lens 2 is fixed by a frame 100 so as to focus on the inlet end face of the optical fiber 3 while its optical axis is in alignment with that of the optical fiber inlet 32. The frame 100 is attached to a stage 101 which can move in a plane perpendicular to the optical axis.

In the optical system of such a construction, when the frame 100 is moved in a plane perpendicular to the optical axis by means of the stage 101 while keeping the optical axis of the laser beam in alignment with that of the optical system, it is possible to change only the angle of incidence while maintaining the converged point of the laser beam on the center of the optical fiber inlet 32.

As to the other portions, they are the same as in the previous embodiment 2, so explanation thereof will be omitted here. By adopting the above construction it is made possible to change the angle of incidence under a control easier than that in the embodiment 2.

Embodiment 4

Figure 10:
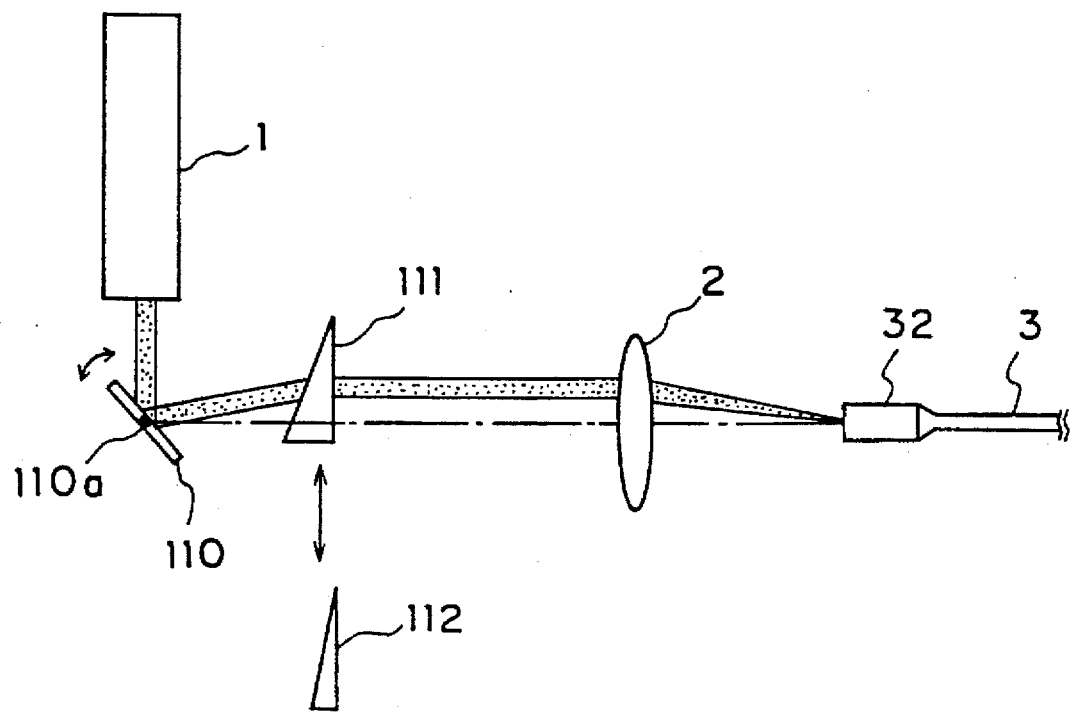
FIG. 10 is a construction diagram showing principal components of an optical transmission system according to embodiment 4 of the present invention.
Figure 11:
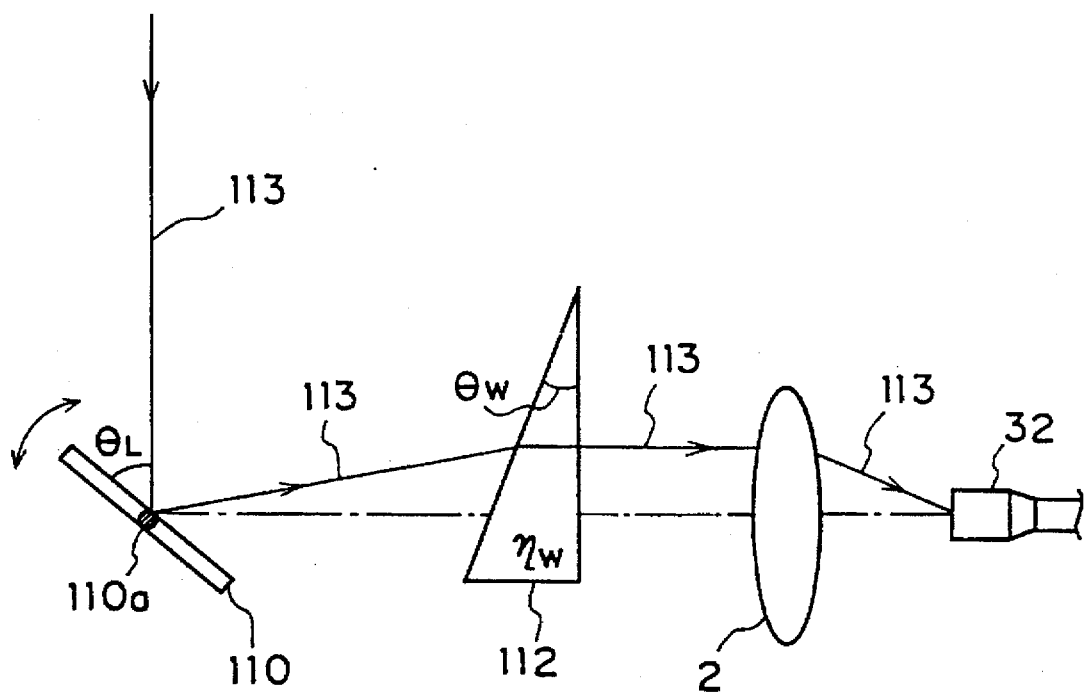
FIG. 11 is a diagram explaining a relation between wedge angle and the angle of rotation of a plane mirror.

Still another embodiment of the present invention will be described below with reference to the accompanying drawings. In this embodiment there is adopted an incidence angle control mechanism of such a construction as shown in FIG. 10. In the same figure, the numeral 110 denotes a plane mirror and numerals 111 and 112 denote wedge substrates. The angle of the plane mirror 110 is set in accordance with the following equation in such a manner that the laser beam after passing the wedge substrate 111 becomes parallel to the optical axis. More specifically, with reference to FIG. 11, if the wedge angle of the wedge substrate 112 is $\theta_W$, the refractive index of the wedge constituent material is $n_W$ and the incidence angle of laser beam $\theta_L$, the angle of the plane mirror 110 is represented as follows:

$$\theta_L = (\pi/2 + \sin^{-1}(n_W \times \sin \theta_W) - \theta_W)/2$$

wherein the unit of the angle is radian. In FIG. 11, the numeral 113 denotes a traveling path of the laser beam and numeral 110a denotes a central axis of rotation of the plane mirror 110.

For example, the angle of incidence is changed by replacing the wedge substrate with a wedge substrate 112 having a different wedge angle and at the same time setting the angle of the plane mirror to an angle obtained by the above equation.

As to the other portions, they are the same as in embodiment 2, so explanation thereof will be omitted here. By adopting the above construction it is made possible to attain a simpler construction than in embodiments 2, 3 and effect a higher speed drive than movement of the optical fiber inlet.

Embodiment 5

Still another embodiment of the present invention will be described below with reference to the accompanying drawings.

Figure 12A:
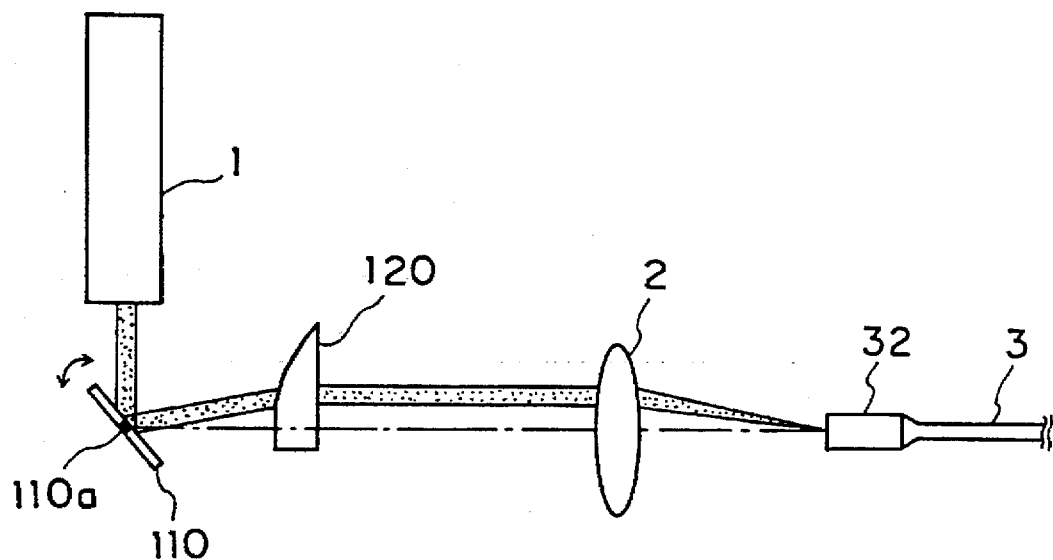
FIGS. 12(a) and 12(b) are construction diagrams showing principal components of an optical transmission system according to embodiment 5 of the present invention.
Figure 12B:
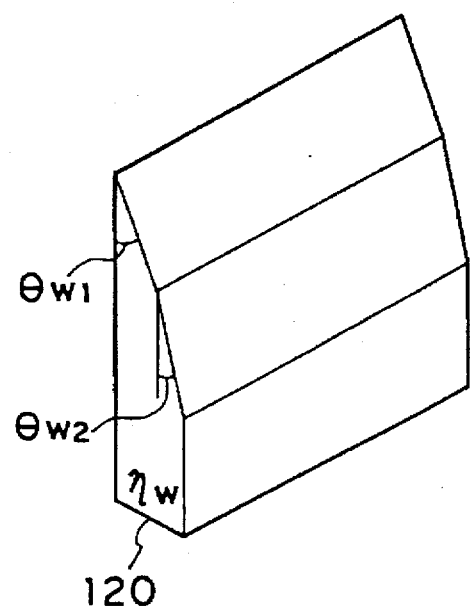

In this embodiment there is used an incidence angle control mechanism of such a construction as shown in FIGS. 12(a) and 12(b). In FIG. 12(a), the numeral 120 denotes a special wedge having two wedge angles for example [see FIG. 12(b)]. The angle of a plane mirror 110 is set in accordance with the following equations in such a manner that the laser beam after passing the special wedge 120 becomes parallel to the optical axis. More specifically, like the preceding embodiment 4, if the special wedge substrate 120 has wedge angles of $\theta_{W1}$ and $\theta_{W2}$, the refractive index of the wedge constituent material is $n_W$ and laser incidence angles are $\theta_{L1}$, $\theta_{L2}$, the plane mirror 110 is set at an angle represented by the following equations in the unit of radian:

$$\theta_{L1} = (\pi/2 + \sin^{-1}(n_W \times \sin \theta_{W1}) - \theta_{W1})/2$$

$$\theta_{L2} = (\pi/2 + \sin^{-1}(n_W \times \sin \theta_{W2}) - \theta_{W2})/2$$

The wedge angles of the special wedge substrate are not limited to two as in the above example. There may be adopted a structure having three or more wedge angles. The numeral 110a in FIG. 11 denotes a central axis of rotation of the plane mirror 110.

The angle of incidence is changed by setting the angle of the plane mirror corresponding to each wedge angle of the special wedge substrate to an angle obtained from the above equations.

As to the other portions, they are the same as in embodiment 2, so explanation thereof will be omitted here. By adopting the above construction it is made possible to change the light intensity distribution at a higher speed than in embodiment 4.

Embodiment 6

Still another embodiment of the present invention will be described below with reference to the accompanying drawings.

Figure 13A:
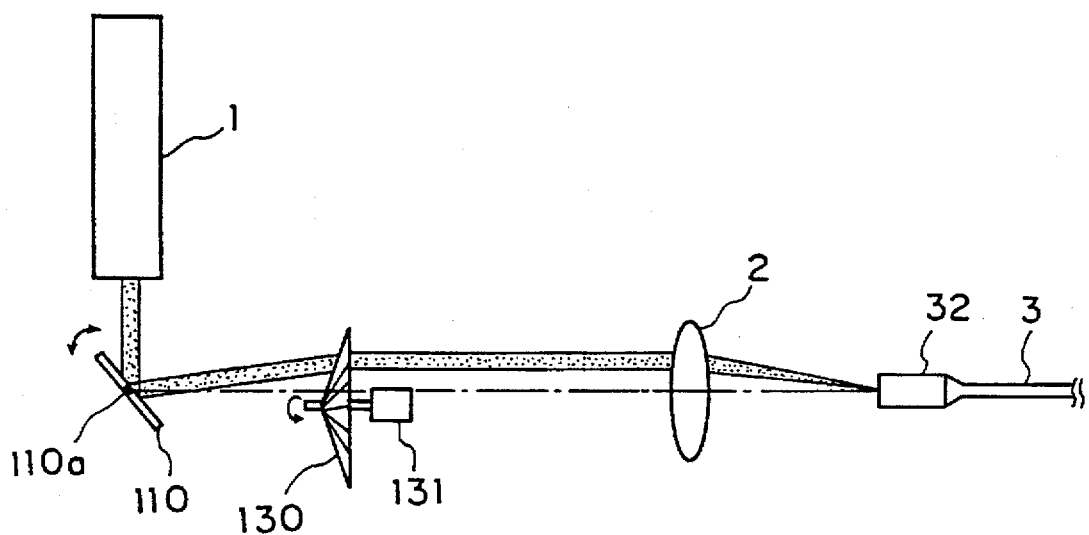
FIGS. 13(a) to 13(c) are construction diagrams showing principal components of an optical transmission system according to embodiment 6 of the present invention.
Figure 13B:
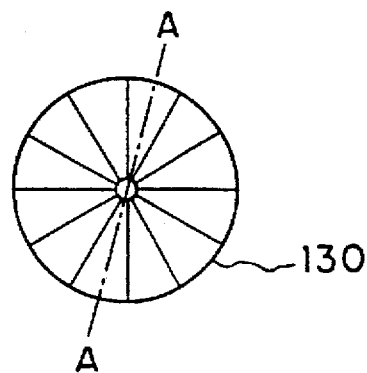
Figure 13C:
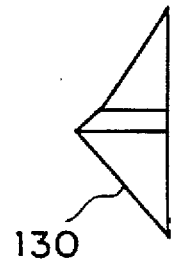

In this embodiment there is adopted an incidence angle control mechanism of such a construction as shown in FIGS. 13(a) to 13(c). In FIG. 13(a), the numeral 130 denotes a special substrate comprising wedge substrates of different wedge angles arranged continuously in the circumferential direction, and numeral 131 denotes a motor. FIG. 13(b) is a top view of the special substrate 130, and FIG. 13(c) is a sectional view taken on line A—A in FIG. 13(b). The angle of the plane mirror 110 to be set is controlled in accordance with the same equation as in embodiment 4 so that the laser beam after passing through the special wedge substrate 130 becomes parallel to the optical axis. The numeral 110a in FIG. 12 denotes a central axis of rotation. The angle of incidence is changed by rotating the plane mirror and the special substrate in synchronism with each other.

Explanation of the other portions will be omitted here because they are the same as in embodiment 2. By adopting the above construction it is made possible to use a larger number of angles and hence possible to realize a smoother and faster change in the light intensity distribution.

Embodiment 7

Still another embodiment of the present invention will be described below. In this embodiment there is adopted an incidence angle control mechanism of such a construction as shown in FIGS. 14(a) to 14(c).

Figure 14A:
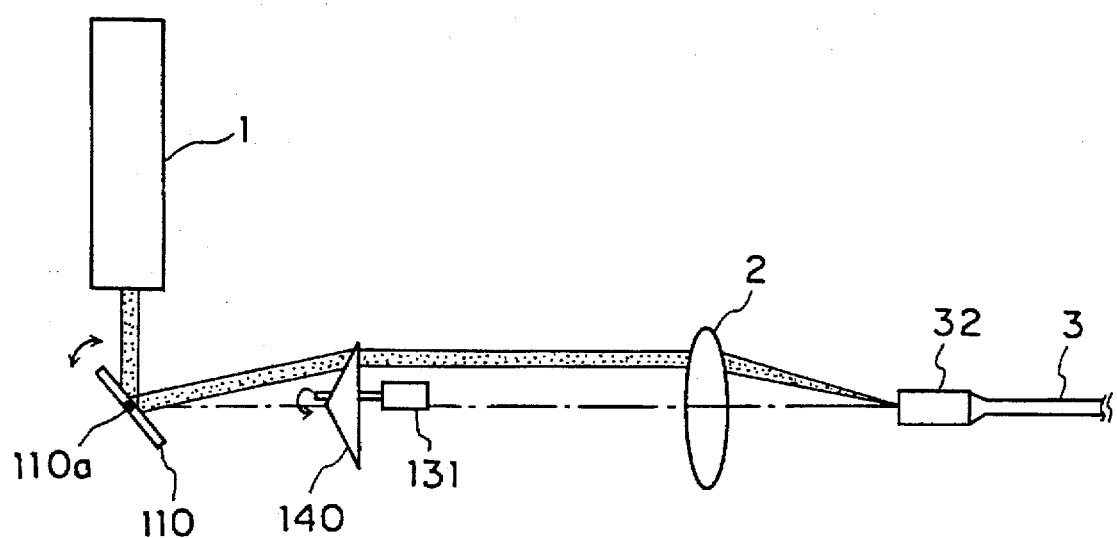
FIGS. 14(a) to 14(c) are construction diagrams showing principal components of an optical transmission system according to embodiment 7 of the present invention.
Figure 14B:
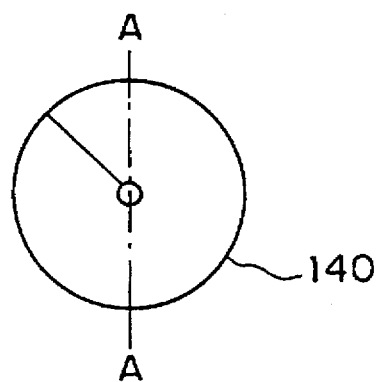
Figure 14C:
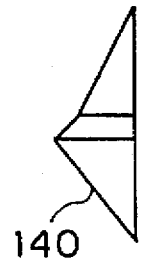

In FIG. 14(a), the numeral 140 denotes a special wedge substrate wherein the wedge angle is constant in the radial direction and the radial wedge angle varies continuously in the circumferential direction. FIG. 14(b) is a top view of the special wedge substrate 140, and FIG. 14(c) is a sectional view taken on line A—A in FIG. 14(b). The angle of a plane mirror 110 to be set is controlled in accordance with the equation as in embodiment 4 in such a manner that the laser beam after passing through the special wedge substrate 140 becomes parallel to the optical axis. The numeral 110a in FIG. 14 denotes a central axis of rotation of the plane mirror 110. The angle of incidence is varied by rotating the plane mirror and the special wedge substrate in synchronism with each other.

Explanation of the other portions will be omitted here because they are the same as in embodiment 2. By adopting the above construction it is made possible to prevent the disturbance of the light intensity distribution caused by the boundary of wedges in embodiment 6.

Embodiment 8

Description is now directed to still another embodiment of the present invention with reference to the accompanying drawings. In this embodiment there is adopted an incidence angle control mechanism of such a construction as shown in FIG. 15.

Figure 15:
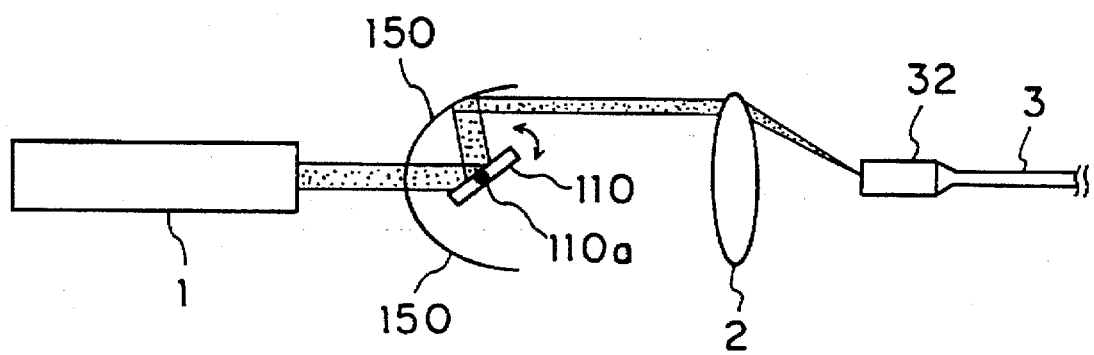
FIG. 15 is a construction diagram showing principal components of an optical transmission system according to embodiment 8 of the present invention.

In FIG. 15, the numeral 150 denotes a parabolic mirror having a top opening and numeral 110 denotes a plane mirror. A central axis of rotation 110a of the plane mirror 110 is set at a focal point of the parabolic mirror 150. The angle of incidence is varied by changing the angle of the plane mirror 110.

Explanation of the other portions is omitted here because they are the same as in embodiment 2. By adopting the above construction it is made possible to attain a simpler construction, a reduced number of drive elements and a higher-speed change of the incidence angle in comparison with the previous embodiments.

Embodiment 9

Description is now directed to still another embodiment of the present invention with reference to the accompanying drawings. In this embodiment there is adopted an incidence angle control mechanism of such a construction as shown in FIG. 16.

Figure 16:
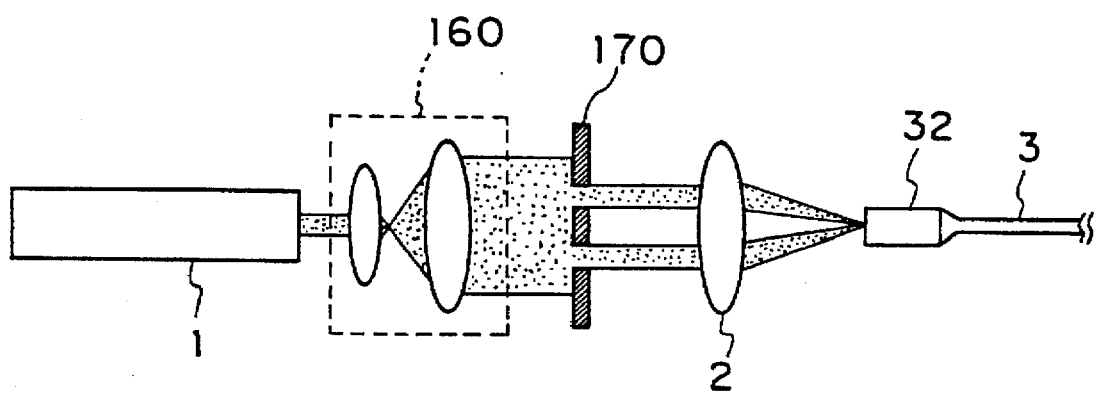
FIG. 16 is a construction diagram showing principal components of an optical transmission system according to embodiment 9 of the present invention.

In FIG. 16, the numeral 160 denotes a zooming optical system for expanding the laser beam, which optical system is composed of two lenses for example. Numeral 170 denotes a light shielding plate. The diameter of the laser beam is expanded by the zooming optical system 160. The laser beam emerging from the zooming optical system is shielded in a circular shape at its central portion by means of the light shielding plate 170, resulting in that it is shaped into an annular form. The thus-shaped laser beam is then converged to the center of the optical fiber inlet end face by means of the condenser lens 2.

The angle of incidence is changed by replacing the light shielding plate 170 with another one different in inside and outside diameters. The construction of the zooming optical system is not limited to the one referred to above. Any other zooming optical system may be used if only it has the function of expanding the beam diameter. Or the zooming optical system may be omitted if the beam diameter is sufficiently large.

Explanation of the other portions is here omitted because they are the same as in embodiment 2. By adopting the above construction, the axial symmetry of the machining beam obtained is improved.

Embodiment 10

Description is now directed to still another embodiment of the present invention with reference to the accompanying drawings. In this embodiment there is adopted an incidence angle control mechanism of such a construction as shown in FIG. 17.

Figure 17:
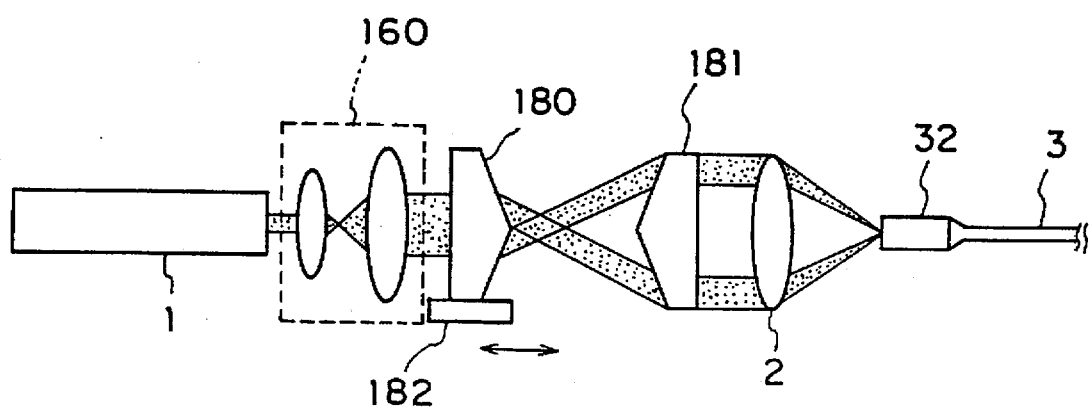
FIG. 17 is a construction diagram showing principal components of an optical transmission system according to embodiment 10 of the present invention.

In FIG. 17, the numeral 160 denotes a zooming optical system for expanding the laser beam, which optical system is composed of two lenses for example. Numerals 180 and 181 denote axicon lenses and numeral 182 denotes a stage which is movable in the optical axis direction.

The diameter of the laser beam is expanded by the zooming optical system 160. The laser beam emerging from the zooming optical system passes through the two axicon lenses 180 and 181 which are disposed opposedly to each other and one of which is disposed on the stage 182 movable in the optical axis direction. The shape of the laser beam passing through the axicon lenses is changed into an annular shape. The diameter of the laser beam thus rendered annular is then changed by moving one axicon lens in the optical axis direction to thereby control the angle of incidence thereof on the optical fiber. The construction of the zooming optical system is not limited to the one referred to above. Any other zooming optical system may be used if only it has the function of expanding the beam diameter.

Explanation of the other portions is here omitted because they are the same as in embodiment 2. By adopting the above construction it is made possible to prevent the loss of energy as compared with embodiment 9 which uses a light shielding plate.

Embodiment 11

Still another embodiment of the present invention will be described below with reference to the accompanying drawings. In this embodiment there is adopted an incidence angle control mechanism of such a construction as shown in FIG. 18.

Figure 18:
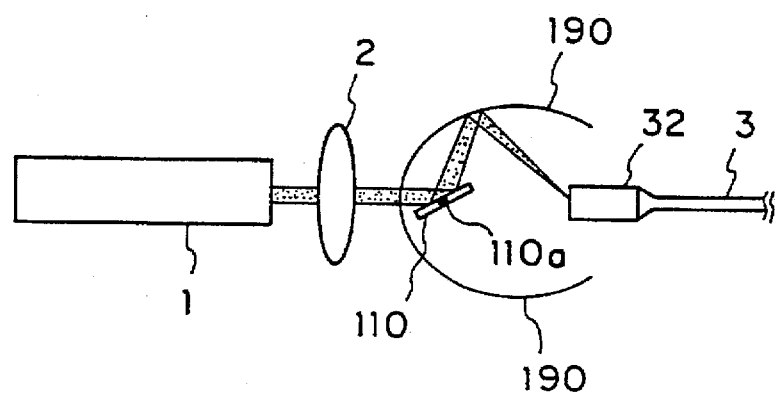
FIG. 18 is a construction diagram showing principal components of an optical transmission system according to embodiment 11 of the present invention.

In FIG. 18, the numeral 190 denotes an elliptic mirror having a top opening and numeral 110 denotes a plane mirror. A central axis of rotation of the plane mirror 110 is positioned at a first focal point of the elliptic mirror 190, while the optical fiber inlet end face 32 is positioned at a second focal point of the elliptic mirror. Since the laser beam from the first focal point of the elliptic mirror has a converging property to the second focal point, the angle of incidence can be controlled by changing the angle of the plane mirror.

As to the other portions, they are the same as in embodiment 2, so explanation thereof is here omitted. By adopting the above construction, like embodiment 8, it is possible to attain a simple construction, a reduced number of drive elements and a high-speed change of the incidence angle.

Embodiment 12

Still another embodiment of the present invention will be described below with reference to the accompanying drawings.

Figure 19A:
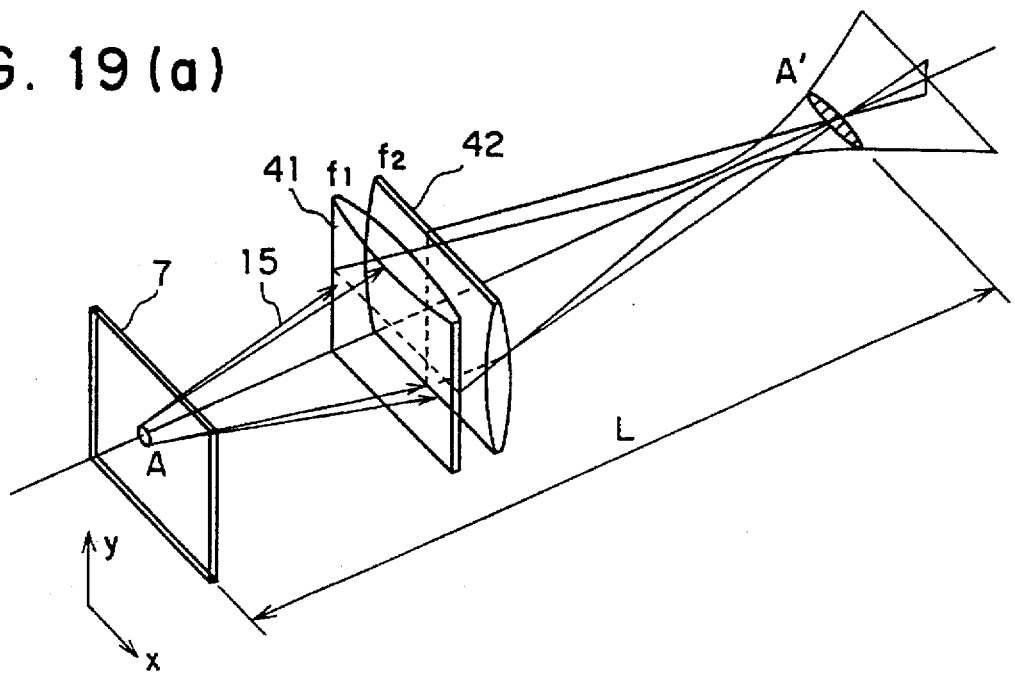
FIGS. 19(a) and 19(b) are construction diagrams showing principal components of an optical transmission system according to embodiment 12 of the present invention.
Figure 19B:
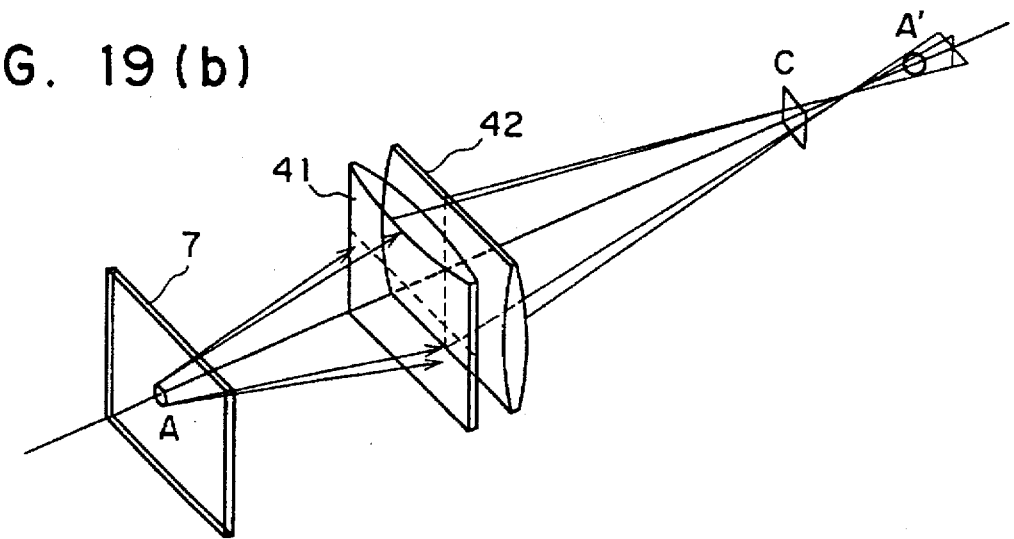

In this embodiment, the spherical lens in the irradiation optical system is substituted by two such cylindrical lenses as shown in FIGS. 19(a) and 19(b), whereby an elliptical shape of beam can be realized.

In FIG. 19(a), the numeral 15 denotes a laser beam emerging from a mask, numeral 41 denotes a cylindrical lens having a refractive force in x-direction in the figure, and numeral 42 denotes a cylindrical lens having a refractive force in y-direction in the figure. Focal length $f_1$ and $f_2$ of both lenses, respectively, have values different from each other. Both lenses 41 and 42 focus in position A'. Magnifications are different between x and y directions, which are $M_1$ and $M_2$, respectively. For desired magnifications $M_1$ and $M_2$ there may be used such lenses as have focal lengths given by the following equations:

$$f_1 = L \cdot M_1/(1+1/M_1)^2$$

$$f_2 = L \cdot M_2/(1+1/M_2)^2$$

where L is the distance between a mask 7 and an object 5 to be irradiated, and $M_1$ and $M_2$ are magnifications in x and y directions, respectively. Therefore, the shape of the beam to be radiated onto the object 5 can be made into an elliptic shape by selecting suitable values of $f_1$ and $f_2$.

FIG. 19(b) shows an example of $M_1 \approx M_2$. In the case of $M_1 \approx M_2$, as illustrated therein, the distribution on the mask face is substantially reproduced in the focusing position A', and it is also possible to obtain a square intensity distribution in the position of defocus point C.

Although according to the construction illustrated in FIGS. 19(a) and 19(b) the beam shape in the mask position in embodiment 1 for example is transferred as it is or after change, the mask may be omitted. Further, also in such a conventional system as shown in FIG. 1, the laser beam emerging from the optical fiber may be focused through two cylindrical lenses as in the above construction to adjust the light intensity distribution in the direction perpendicular to the optical axis.

Embodiment 13

Still another embodiment of the present invention will be described below. This embodiment relates to the focusing optical system 4 used in the foregoing embodiments. In this embodiment, the light intensity distribution in the optical axis direction is adjusted, and more specifically the focal depth is improved in consideration of machining.

Figure 20:
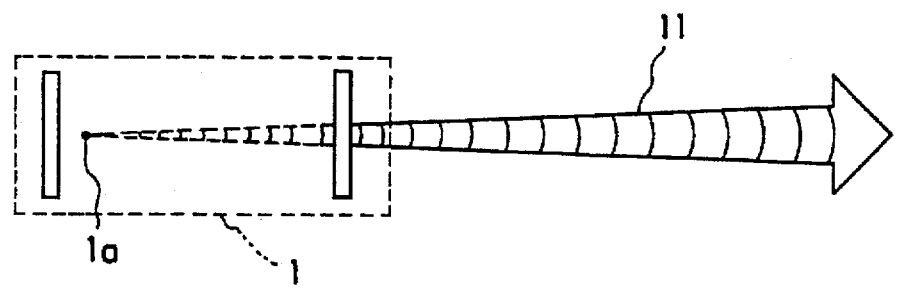
FIG. 20 is an explanatory diagram showing a modeled form of laser beam emitted from a laser oscillator.
Figure 21:
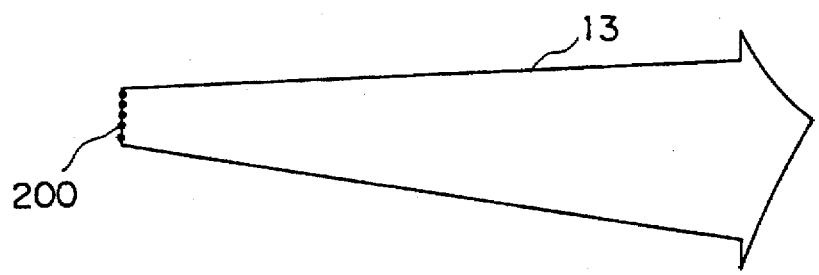
FIG. 21 is an explanatory diagram showing a modeled form of laser beam emerging from an optical fiber.

FIG. 20 shows a modeled state of laser beam 11. In the same figure, the laser beam 11, which is an ordinary type beam, is very high in coherency, and even if the beam 11 emitted from the laser oscillator 1 has a finite, it can be regarded that the beam is emitted from a point source 1a located at the curvature center of wave surface on the laser exit side. On the other hand, the light beam from the outlet end face of the optical fiber or from the focusing point thereof must be regarded as a group of point sources, namely the light beam from a surface illuminant 200. This condition can be expressed in terms of light rays as in FIG. 21.

Figure 22:
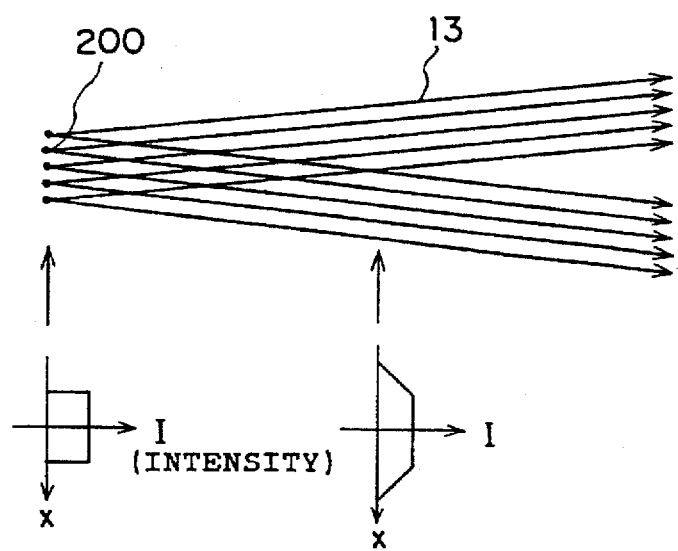
FIG. 22 is a diagram explaining a change in the intensity distribution of laser beam emerging from the optical fiber.

In this case, the light intensity distribution is illustrated as in FIG. 22. That is, the light intensity distribution changes from a rectangular shape at an optical fiber end face to a chevron shape having a gentle foot portion as the light beam propagates.

Figure 23:
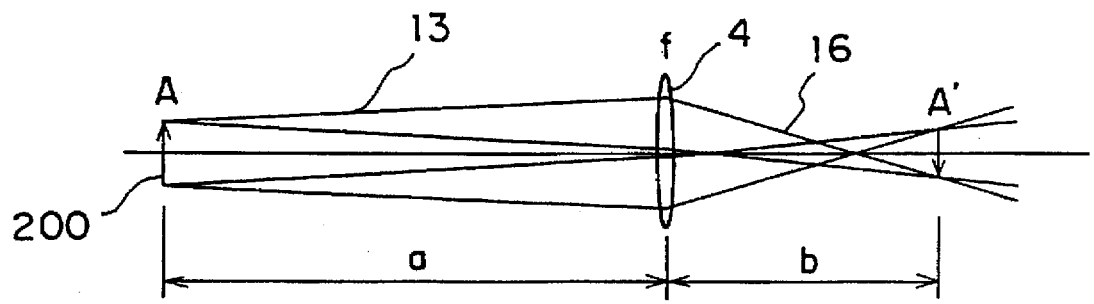
FIG. 23 is an explanatory diagram showing a conventional transfer optical system.

Such a conventional optical system as referred to above which focuses the light beam onto the object 5 to be irradiated is shown in FIG. 23. This optical system uses a single lens 4 or a set of lenses having the same function. If the focal length of the lens 4 or combined lenses is f, the distance from an optical fiber end 200 to a first principal plane of the lens 4 or combined lenses is a and the distance to a second principal plane thereof is b, the following relationship is satisfied:

$$1/f = 1/a + 1/b$$

In this case, the condition of light rays is as shown in FIG. 23. That is, the beam expands as it goes away from a focusing position A' of A at the fiber end 200, thus giving rise to the problem that the focal depth is small.

Figure 24:
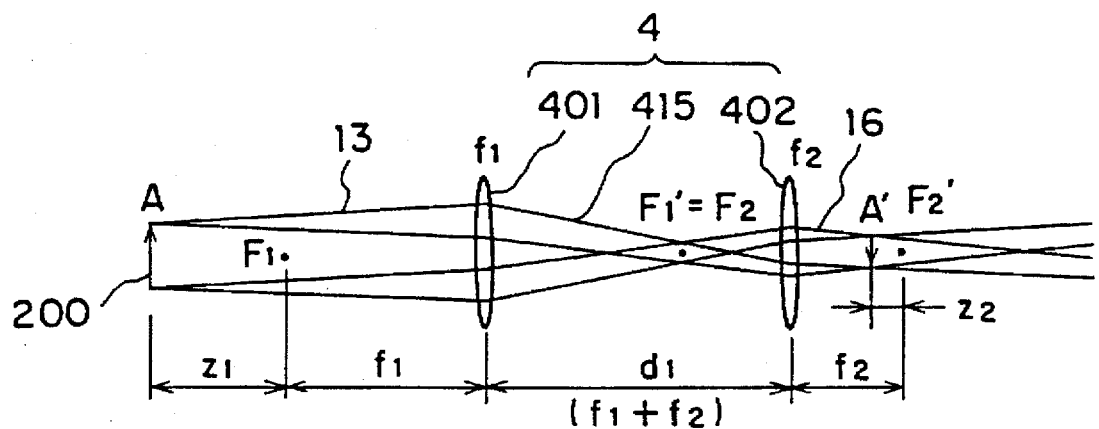
FIG. 24 is a diagram explaining a focusing optical system comprising two groups of lenses in embodiment 13 of the present invention.

On the other hand, in this embodiment 13, as shown in FIG. 24, an optical system 4 comprising two groups of lenses is used for radiating the laser beam 13 from the optical fiber onto the object 5 to be irradiated. In FIG. 24, the numeral 401 denotes a first lens group, numeral 402 denotes a second lens group and numeral 415 represents the laser beam. The first and second lens groups 401, 402 are disposed so that an image-side focal position $F_1'$ of the first lens group and an object-side focal position $F_2$ of the second lens group are coincident with each other. More specifically, using the focal lengths $f_1$ and $f_2$ of the first and second lens groups, respectively, the distance $d_1$ between a second principal plane of the first lens group 401 and a first principal plane of the second lens group 402 is set at $d_1 = f_1 + f_2$. Further, both lens groups are disposed so as to satisfy the following relationship:

$$z_2 = M^2 z_1, \quad M = f_2/f_1$$

where $z_1$ represents the distance between an object-side focal position $F_1$ of the first lens group 401 and the fiber end A, and $z_2$ represents the distance between an image-side focal position $F_2'$ of the second lens group and the position A' of the object to be irradiated.

In this case, the condition of light rays is as illustrated in FIG. 24. When looking at the direction extending away from the focusing position A' of the fiber end A, it is seen that the light beam 16 is radiated nearly perpendicularly to the object 5 and that therefore the convergibility of beam energy is high and a large focal depth is obtained, in comparison with the foregoing focusing system comprising one lens group.

Figure 25:
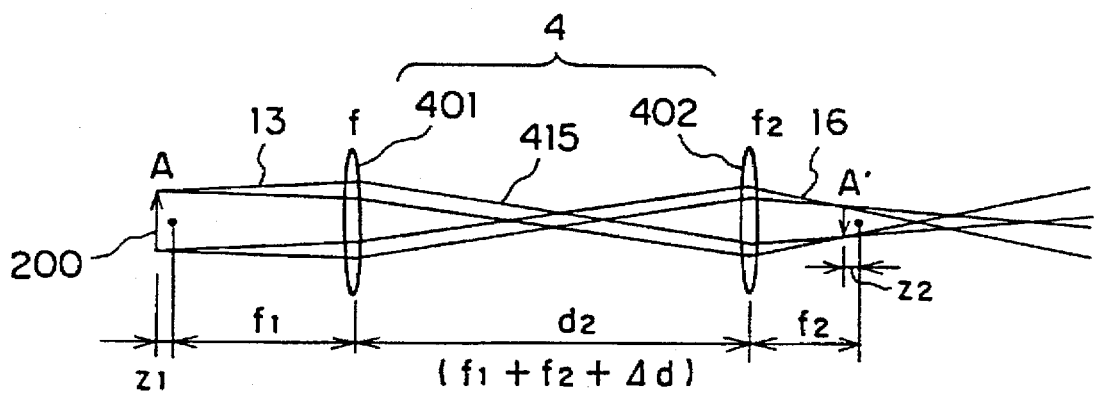
FIG. 25 is a diagram explaining another focusing optical system comprising two groups of lenses in embodiment 13.

It is the construction shown in FIG. 25 that is a further improvement over the above construction. In FIG. 25, the distance from the second principal plane of the first lens group 401 to the first principal plane of the second lens group 402 is set as follows:

$$d_2 = f_1 + f_2 + \Delta d, \quad (\Delta d \gtreqless 0)$$

In this case, a focusing relationship is expressed as follows:

$$z_2 = M(f_2/f_1) z_1,$$

$$M = f_1 f_2/(z_1 \Delta d + f_1^2).$$

These equations can be rewritten as follows:

$$z_1 = f_1 f_2 z_2/(z_1 \Delta d + f_1^2).$$

By changing $\Delta d$ it is made possible to change the propagation condition of the beam in its position A' on the object and the following positions. In comparison with the simple case of $\Delta d = 0$, the focal depth can be made still larger. In particular, the above effect is enhanced when the following conditions are satisfied:

$$f_1 > 0, f_2 > 0, \Delta d > 0, \text{ and}$$

$$-f_1^2/(f_2 \Delta d) < z_1 < f_1$$

The optical system which enlarges the focal depth has been described above, but in actual machining, scatters are generated from the object 5, so if the lens 4 is located near the object 5, the scatters will be deposited on the lens surface and give rise to problems such as deterioration of the transmittance of light for example. Therefore, the longer the distance (work distance) between the object 5 and the lens 4, the more desirable. So in this embodiment it is necessary to use as a single lens group a set of lenses having a long work distance which will be described below.

Figure 26:
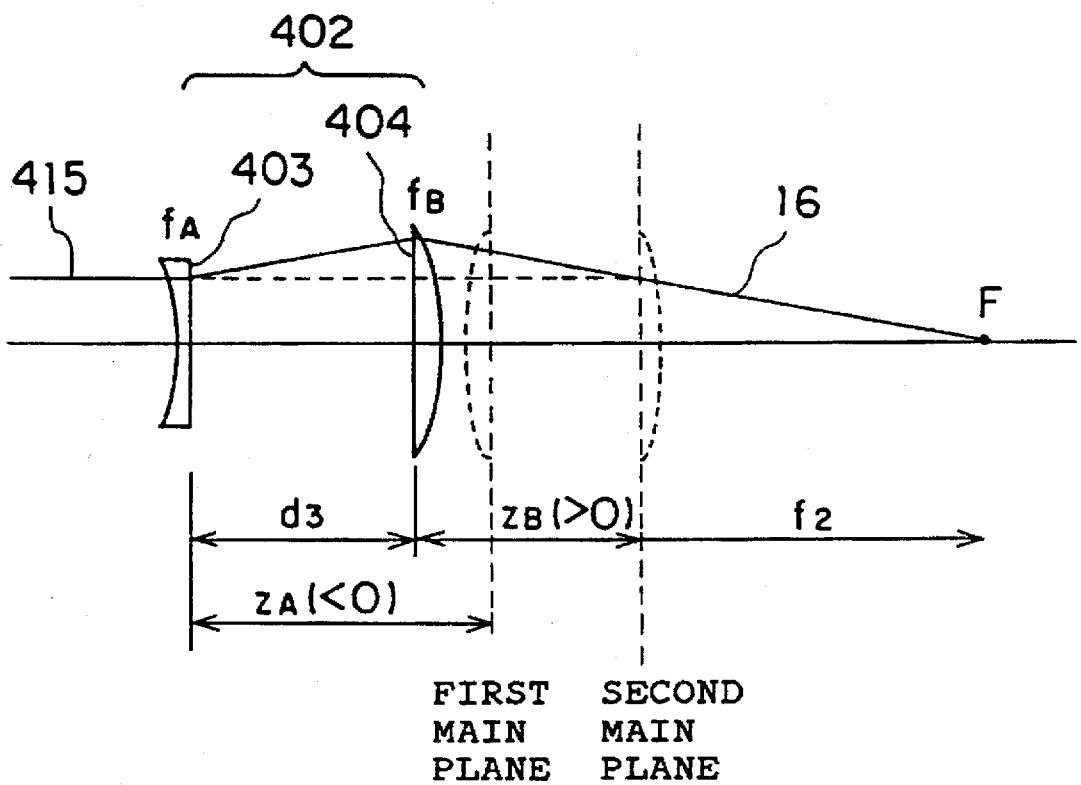
FIG. 26 is a diagram explaining still another focusing optical system comprising two groups of lenses in embodiment 13.

In the construction of concave lens 430/convex lens 404 shown in FIG. 26, the combination of two lenses exhibits the same function as that of a single lens 402. In this case, by suitably setting the focal length of the concave lens and that of the convex lens as well as the spacing between both lenses it is made possible to position first and second principal planes of this compound lens on the right-hand side of the convex lens 404. More specifically, if the focal length of the concave lens 403 is $f_A$, that of the convex lens 404 is $f_B$ and the distance between a second principal plane of the concave lens 403 and a first principal plane of the convex lens is $d_3$, the focal length $f_2$ of the compound lens is given by the following equation:

$$f_2 = f_A f_B/(f_A + f_B - d_3)$$

Further, if the distance between a first principal plane of the concave lens 403 and that of the compound lens is $z_A$ and the distance between a second principal plane of the convex lens 404 and that of the compound lens is $z_B$, both are given by the following equations:

$$z_B = -d_3 f_2/f_A$$

($z_B$, when positive value, rightward)

$$z_A = -d_3 f_2/f_A$$

($z_A$, when negative value, rightward)

Since $f_A$ is the focal length of the concave lens 403, there exists the condition of $f_A < 0$, and since the focal length $f_2$ of the compound lens and $d_3$ are both larger than 0, there exists the condition of $z_B > 0$. By suitably selecting the values of $d_3$, $f_A$ and $f_2$ it becomes possible to position the second principal plane of the compound lens on the object side, so it is possible to enlarge the lens-object distance in comparison with the use of a single lens having the focal length $f_2$.

In the case of such a focusing optical system comprising two groups of lenses as shown in FIG. 24 or 25, the focal length is large, but there arises the problem that the work distance is short as compared with the focusing optical system using a single group of lenses.

Figure 27:
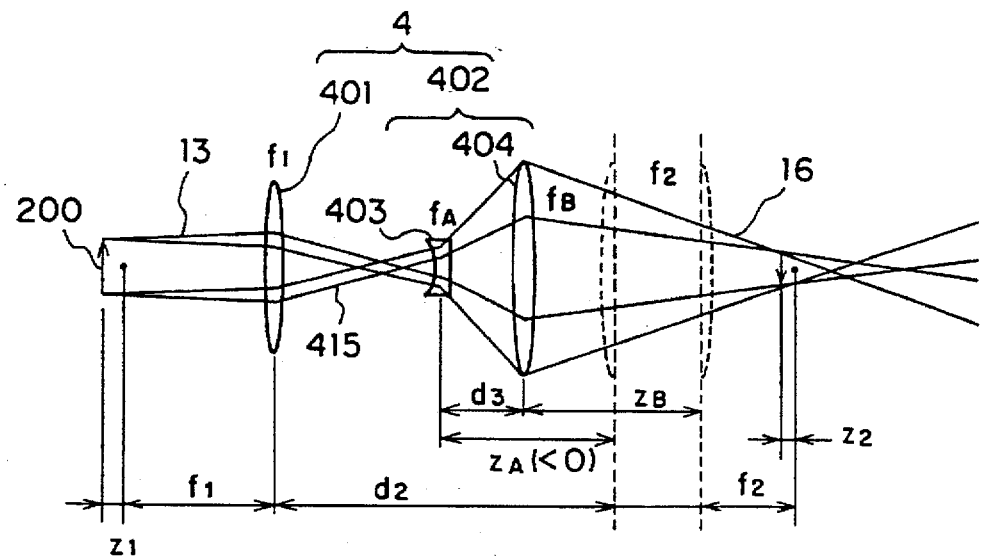
FIG. 27 is a diagram explaining still another focusing optical system comprising two groups of lenses in embodiment 13.

To cope with this problem, the work distance can be extended by using such a set of lenses as involves shifting of the second principal plane from the lens position, as explained above. FIG. 27 shows an example in which the second lens group 402 in the focusing optical system comprising two groups of lenses illustrated in FIG. 24 or 25 is constituted by a set of concave lens 403 and convex lens 404 to extend the work distance. How to calculate distances is as described above.

Figure 28:
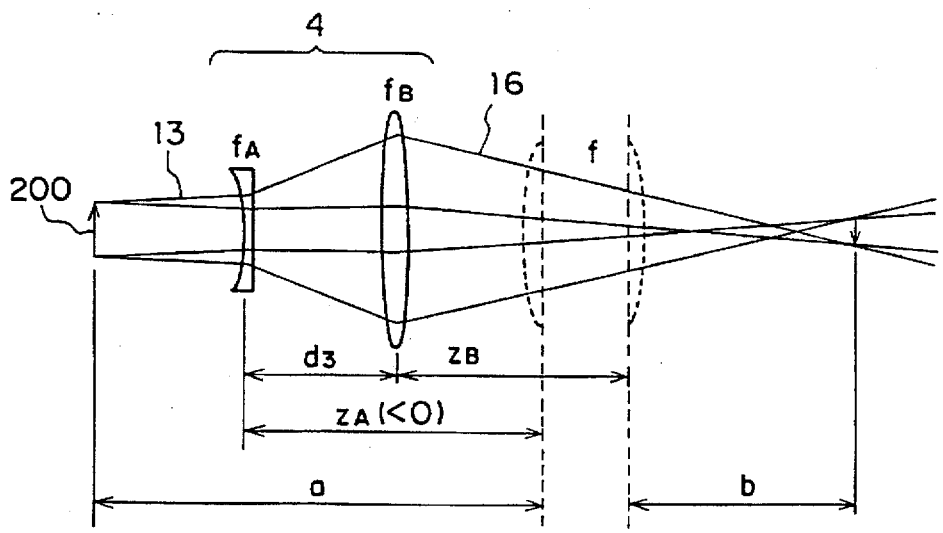
FIG. 28 is a diagram explaining a focusing optical system comprising one group of lenses in embodiment 13.

Also in the case of the focusing optical system comprising a single lens group 4, which has been explained above in connection with FIG. 23, an optical system having a long work distance as shown in FIG. 28 can be constituted by using a set of concave and convex lenses.

Although in the above embodiment the light from the outlet end face of the optical fiber was regarded as light from the surface illuminant 200, the light from the focusing point, or the light from the mask position in embodiment 1 for example, may be regarded as the light from the surface illuminant, using the same construction as above.

Also with respect to the optical system using two groups of cylindrical lenses, shown in FIGS. 19(a) and 19(b), the focal length can be made larger by using an optical system comprising two groups of lenses for each of the cylindrical lenses.

Embodiment 14

When machining is performed using any of the optical transmission systems of the invention described in the above embodiments, the intensity distribution of the radiating light may be changed for each certain area of the object to be irradiated.

Figure 29:
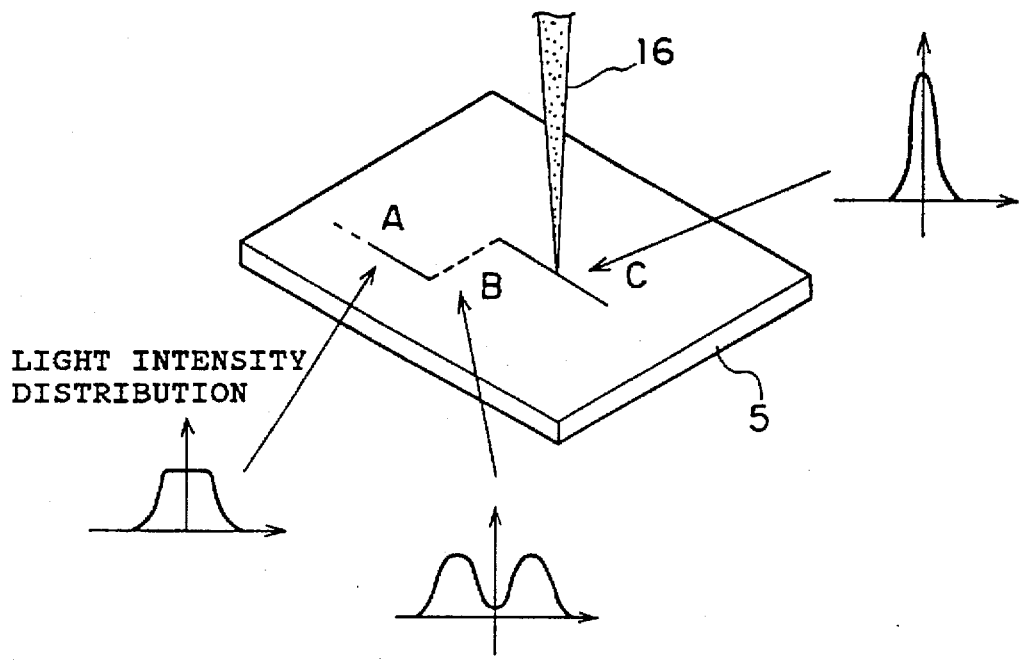
FIG. 29 is a diagram explaining a light radiating method according to embodiment 14 of the present invention.

FIG. 29 illustrates a concept of the irradiation method. As shown therein, irradiation is performed using a flat intensity distribution, a concave intensity distribution and a large peak intensity distribution for areas A, B and C, respectively. This method permits welding, cutting, marking, etc. to be done at a time in a single operation and also permits handling thicknesses and materials which are different between areas.

Embodiment 15

In the optical transmission system according to the present invention there may be adopted a construction wherein as the laser oscillator there is used a pulse oscillation type and wherein the light intensity distribution is changed in one pulse of the laser beam and this change in one pulse is repeated for each pulse.

Figure 30:
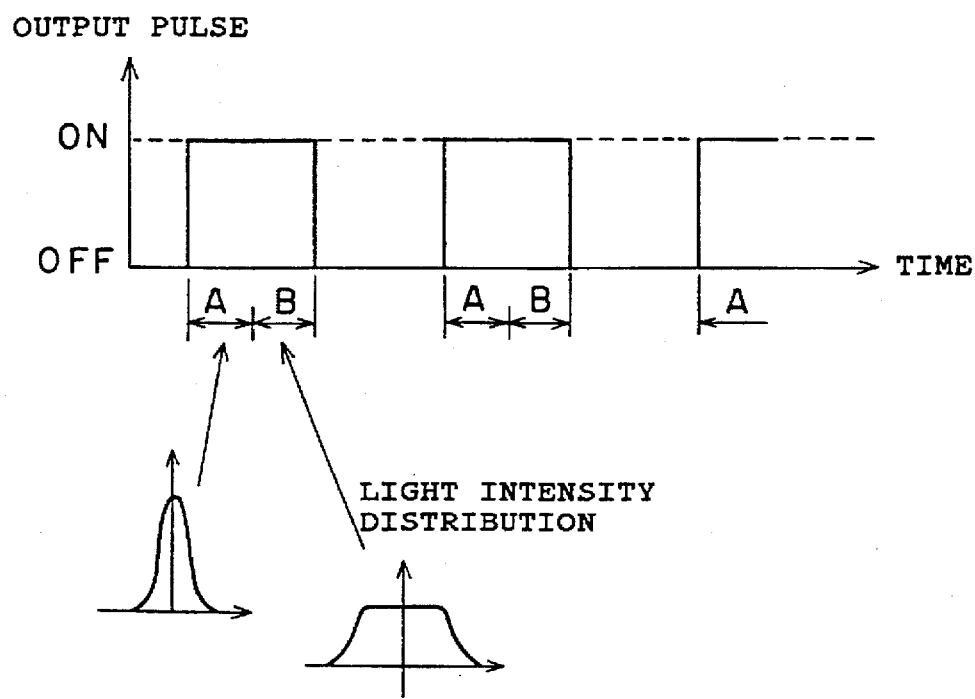
FIG. 30 is a diagram explaining a light radiating method according to embodiment 15 of the present invention.

The concept of this irradiation method is shown in FIG. 30. With output pulse ON (laser beam is emitted), there is used a large peak intensity distribution in area A, while in area B there is used a flat intensity distribution with small peak, as shown in FIG. 30. By so doing, the energy density for the material used can be changed, so that it is possible to effect welding, cutting and piercing in high quality.

In this embodiment, how to select the intensity distribution in one pulse is not limited to the one described above. There may be used a suitable combination.

As set forth above, in the first aspect of the present invention, since there is used an adjusting means for adjusting the light intensity distribution in the optical axis direction or in a plane perpendicular to the optical axis to a predetermined light intensity distribution in the vicinity of an object to be irradiated at the time of propagating the laser beam from the laser oscillator by a predetermined distance and radiating the propagated light beam onto the object to be irradiated, it is possible to effect any desired machining.

In the second aspect of the present invention, since the irradiation optical system and adjusting means are composed of a first lens which forms images with aberration and a second lens which forms on the object to be irradiated an image located in a position having a predetermined light intensity distribution from among the images formed by the first lens, it is possible to form on the object an image having a desired light intensity distribution in the direction perpendicular to the optical axis, thus permitting any desired machining to be effected.

In the third aspect of the present invention, since there is used an adjusting mechanism capable of adjusting the distance between the first and second lenses, various shapes of machining beams can be obtained easily by merely changing the said distance.

In the fourth aspect of the present invention, since a mask is disposed in the focusing position of the first lens, there can be easily obtained various shapes of machining beams according to mask shapes.

In the fifth aspect of the present invention, since the shape of the above mask is made circular to permit the passing of light through only the circular portion, there is obtained a circular machining beam and hence it is possible to effect uniform irradiation.

In the sixth aspect of the present invention, since the shape of the above mask is made annular to permit the passing of light through only the annular portion, there is obtained an annular machining beam, thus making uniform irradiation possible even in the case of performing a machining while scanning the beam.

In the seventh aspect of the present invention, since in the optical transmission system in the first aspect the propagation optical system is composed of an optical fiber and a condenser lens for converging the laser beam from the laser oscillator into the optical fiber, the irradiation optical system is constituted by a transfer optical system which transfers onto the object to be irradiated an image present in a plane perpendicular to the optical axis and spaced a predetermined distance from the outlet end face of the optical fiber, and the adjusting means is constituted by a means which adjusts the angle of incidence of the laser beam converged by the condenser lens on the optical fiber, it is possible to obtain various shapes of machining beams.

In the eighth aspect of the present invention, since the adjustment by the above adjusting means is realized by changing the angle of the optical fiber inlet end face while keeping the center of the said inlet end face in alignment with the optical axis, only the incidence angle can be changed while maintaining the laser beam on the center of the optical fiber inlet.

In the ninth aspect of the present invention, since the adjustment by the above adjusting means is realized by moving a fixed optical system in a plane perpendicular to the optical axis in an aligned state of the optical axis of the condenser lens with that of the optical fiber, with the optical fiber inlet end face fixed to the focal position of the condenser lens, and while maintaining the optical axis of the laser beam from the laser oscillator in parallel with that of the fixed optical system, the angle of incidence can be controlled by an easy control.

In the tenth aspect of the present invention, since the adjustment by the above adjusting means is realized by moving the laser beam from the laser oscillator in a plane perpendicular to the optical axis in a fixed state of the optical fiber inlet end face to the focal position of the condenser lens and while keeping the optical axis of the laser beam in parallel with that of the condenser lens, it is possible to effect a higher-speed drive than movement of the optical fiber inlet.

In the eleventh aspect of the present invention, since a plane mirror whose angle to the optical axis can be changed and a wedge substrate are disposed between the laser oscillator and the condenser lens and the shifting of the laser beam in a plane perpendicular to the optical axis is performed by replacing the wedge substrate with another wedge substrate having a different wedge angle simultaneously with changing the angle of the plane mirror, there is attained simplification of the construction.

In the twelfth aspect of the present invention, since a plane mirror whose angle to the optical axis can be changed and a special wedge angle having plural wedge angles are disposed between the laser oscillator and the condenser lens and the shifting of the laser beam in a plane perpendicular to the optical axis is performed by changing the angle of the optical mirror, it is possible to change the light intensity distribution at high speed.

In the thirteenth aspect of the present invention, since a plane mirror whose angle to the optical axis can be changed and a special disk-like substrate comprising wedge substrates of different wedge angles arranged continuously in the circumferential direction are disposed between the laser oscillator and the condenser lens and the shifting of the laser beam in a plane perpendicular to the optical axis is performed by rotating the special substrate in synchronism with the angular change of the plane mirror, it is possible to attain a smoother and faster change of the light intensity distribution.

In the fourteenth aspect of the present invention, since a plane mirror whose angle to the optical axis can be changed and a special substrate having a constant wedge angle in the radial direction and continuously varying wedge angles in the circumferential direction are disposed between the laser oscillator and the condenser lens and the shifting of the laser beam in a plane perpendicular to the optical axis is performed by rotating the special substrate in synchronism with the angular change of the plane mirror, it is possible to prevent the disturbance of the light intensity distribution caused by the boundary of wedges at the time of varying the light intensity distribution.

In the fifteenth aspect of the present invention, since a parabolic mirror is disposed between the laser oscillator and the condenser lens, a plane mirror whose angle can be changed is disposed in the focal position of the parabolic mirror and the shifting of the laser beam in a plane perpendicular to the optical axis is performed by changing the angle of the parabolic mirror, it is possible to attain a simple construction, a reduced number of drive elements and a high-speed change of the incidence angle.

In the sixteenth aspect of the present invention, since the adjustment by the above adjusting means is realized by shaping the intensity distribution of the laser beam incident on the condenser lens in a plane perpendicular to the optical axis into an annular form having desired inside and outside diameters, the axial symmetry of the machining beam obtained is improved.

In the seventeenth aspect of the present invention, since two axicon lenses are disposed opposedly to each other between the laser oscillator and the condenser lens and the shaping of the laser beam into an annular form having desired inside and outside diameters is performed by changing the spacing between the two axicon lenses, it is possible to prevent the loss of energy in the use of a light shielding plate.

In the eighteenth aspect of the present invention, since an elliptic mirror is disposed between the condenser lens and the optical fiber inlet end face, a plane mirror whose angle to the optical axis can be changed is disposed in a first focal position of the elliptic mirror, the optical fiber inlet end face is disposed in a second focal position of the elliptic mirror and the adjustment by the above adjusting means is realized by changing the angle of the plane mirror, it is possible to attain a simple construction, a reduced number of drive elements and a high-speed change of the incidence angle.

In the nineteenth aspect of the present invention, since the irradiation optical system has a focusing optical system comprising two groups of cylindrical lenses having radii of curvature in direction orthogonal to each other, it is possible to obtain an oblong shape or any other desired shape as the shape of the laser beam for irradiation of the object to be irradiated.

In the twentieth aspect of the present invention, the focusing optical system in the irradiation optical system comprises two lens groups and if the distance from a second principal plane of the first lens group to a first principal plane of the second lens group is d, the focal lengths of the first and second lens groups are $f_1$ and $f_2$, respectively, the distance from a predetermined position of the transmitted light to an object-side focal position of the first lens group is $z_1$ and the distance from an image-side focal position of the second lens group to the object to be irradiated is $z_2$, the following conditions are satisfied:

$$d = f_1 + f_2 + \Delta d$$

$$z_1 = f_1 f_2 z_2 / (z_1 \Delta d + f_1^2)$$

therefore, it is possible to adjust the light intensity distribution in the optical axis direction and there is obtained a large focal depth.

In the twenty-first aspect of the present invention, the focal length can be made still larger because the focusing optical system satisfies the following conditions:

$$-f_1^2/(f_2 + \Delta d) > z_1 < f_1$$

$$f_1 > 0, f_2 > 0$$

$$\Delta d > 0$$

In the twenty-second aspect of the present invention, the above second lens group is a set of concave lens and convex lens and if the focal length of this compound lens is $f_2$, that of the concave lens 403 is $f_A$, that of the convex lens 404 is $f_B$, the distance between a second principal plane of the concave lens and a first principal plane of the convex lens is $d_3$, the distance between a first principal plane of the concave lens and a first principal plane of the compound lens is $z_A$ and the distance between a second principal plane of the convex lens and a second principal plane of the compound lens is $z_B$, the following conditions are satisfied:

$$f_2 = f_A f_B / (f_A + f_B - d_3)$$

$$z_B = -d_3 f_2 / f_A$$

($z_B$, when positive value, rightward)

$$z_A = -d_3 f_2 / f_B$$

($z_A$, when negative value, rightward)

therefore, it is possible to enlarge the lens-object distance, thus reducing the fear of scatters from the object during machining being deposited on the lens surface and causing deterioration of the transmittance of light.

In the twenty-third aspect of the present invention, since the predetermined position of the transmitted light in the above optical transmission system is set at the outlet end face of the optical fiber, it is possible to take a large focal depth also for the optical transmission system of the conventional construction.

In the twenty-fourth aspect of the present invention, since the intensity distribution of the irradiation light is changed for each certain area of the object to be irradiated at the time of radiating the laser beam to the object in any of the above optical transmission systems, it is possible to effect welding, cutting, marking, etc. at a time in a single operation and also possible to cope with different thicknesses and materials between areas.

In the twenty-fifth aspect of the present invention, since a laser oscillator of a pulse oscillation type is used as the laser oscillator in each of the above optical transmission systems, the light intensity in one pulse of the laser beam is changed at the time radiating the laser beam to the object to be irradiated and the said change in one pulse is repeated for each pulse, the energy density for the material can be changed and hence it is possible to effect welding, cutting and piercing in high quality.

While preferred embodiments of the present invention have been described, such description is for illustrative purposes only, and it is to be understood that changes and modifications may be made without departing from the spirit and scope of the following claims.

What is claimed is:

1. An optical transmission system including:

a laser oscillator;

a propagation optical system for propagating a laser beam emitted from said laser oscillator by a predetermine distance;

an irradiation optical system for radiating the propagated laser beam onto an object to be irradiated;

an adjusting means for adjusting a shape of a light intensity distribution corresponding to the propagated laser beam in the direction of an optical axis or in a plane perpendicular to the optical axis and in the vicinity of the object to be irradiated;

wherein said irradiation optical system and said adjusting means comprise:

a first lens for forming images with aberration and a second lens for forming on the object to be irradiated an image located in a position having a predetermined light intensity distribution from among the images formed by said first lens and further including an adjusting mechanism capable of adjusting the distance between said first lens and said second lens; and wherein a mask is disposed in a focal position of the first lens.

2. An optical transmission system according to claim 1, wherein said mask has a circular shape so as to permit the laser beam to pass through only the circular portion.

3. An optical transmission system according to claim 1, wherein said mask has an annular shape so as to permit the laser beam to pass through only the annular portion.

4. An optical transmission system including:

a laser oscillator;

a propagation optical system for propagating a laser beam emitted from said laser oscillator by a predetermined distance;

an irradiation optical system for radiating the propagated laser beam onto an object to be irradiated; and an adjusting means for adjusting a shape of a light intensity distribution corresponding to the propagated laser beam in the direction of an optical axis or in a plane perpendicular to the optical axis and in the vicinity of the object to be irradiated;

wherein said irradiation optical system has a focusing optical system for focusing a light beam from a light source onto the object to be irradiated at a predetermined magnification, said focusing optical system comprising two lens groups, and when the distance from a second principal plane of the first lens group to a first principal plane of the second lens group is d, the focal lengths of the first and second lens groups are $f_1$ and $f_2$, respectively, the distance from a predetermined position of the propagated laser beam to an object-side focal position of the first lens group is $z_1$ and the distance from an image-side focal position of the second lens group to the object to be irradiated is $z_2$, the following conditions are satisfied:

$$d = f_1 + f_2 + \Delta d$$

$$z_1 = f_1 f_2 z_2 / (z_1 \Delta d + f_1^2)$$

$$-f_1^2/(f_2 + \Delta d) < z_1 < f_1$$

$$f_1 > 0, f_2 > 0$$

$$\Delta d > 0.$$

5. An optical transmission system including:

a laser oscillator;

a propagation optical system for propagating a laser beam emitted from said laser oscillator by a predetermined distance; and an irradiation optical system for radiating the propagated laser beam onto an object to be irradiated, wherein said irradiation optical system has a focusing optical system for focusing a light beam from a light source onto the object to be irradiated at a predetermined magnification, said focusing optical system comprising two lens groups, wherein a distance from a second principal plane of a first lens group to a first principal plane of a second lens group is d, the focal lengths of the first and second lens groups are $f_1$ and $f_2$, respectively, a distance from a predetermined position of the propagated laser beam to an object-side focal position of the first lens group is $z_1$, and a distance from an image-side focal position of the second lens group to the object to be irradiated is $z_2$, the following conditions are satisfied:

$$d = f_1 + f_2 + \Delta d$$

$$z_1 = f_1 f_2 z_2 / (z_1 \Delta d + f_1^2)$$

$$-f_1^2/(f_2 + \Delta d [<m]ed) < z_1 < f_1$$

$$f_1 > 0, f_2 > 0$$

$$\Delta d > 0.$$

6. An optical transmission system according to claim 4:

wherein the second lens group is a set of concave lens and convex lens, and if the focal length of a compound lens if $f_2$ that of the concave lens (403) is $f_A$, that of the convex lens (404) is $f_B$, the distance between a second principal plane of the concave lens and a first principal plane of the convex lens is $d_3$, the distance between a first principal plane of the concave lens and a first principal plane of the compound lens is $z_A$ and the distance between a second principal plane of the convex lens and a second principal plane of the compound lens is $z_B$, the following conditions are satisfied:

$$f_2 = f_A f_B / (f_A + f_B - d_3)$$

$$z_B = -d_3 f_2 / f_A$$

($z_B$, when positive value, rightward)

$$z_A = -d_3 f_2 / f_B$$

($z_A$, when negative value, rightward).

7. An optical transmission system according to claim 4, wherein said predetermined position of the propagated laser beam is an outlet end face of an optical fiber.

* * * * *

UNITED STATES PATENT AND TRADEMARK OFFICE

CERTIFICATE OF CORRECTION

PATENT NO. : 5,684,642

DATED : November 4, 1997

INVENTOR(S): Nobuyuki ZUMOTO, Teruo MIYAMOTO, Toshinori YAGI and Masaaki TANAKA

It is certified that errors appear in the above-identified patent and that said Letters Patent is hereby corrected as shown below:

(1) In col 8, line 48, change "$z_1 = f_1 f_2 z_2 / (z_1 \Delta d = f_1^2)$" to
--$z_1 = f_1 f_2 z_2 / (z_1 \Delta d + f_1^2)$--.

(2) In col 15, line 42, change "$\theta_{L1} = (\pi/2 + \sin^{-1}(n_W \times \sin\theta_{W1}) = \theta_{W1})/2$" to
--$\theta_{L1} = (\pi/2 + \sin^{-1}(n_W \times \sin\theta_{W1}) - \theta_{W1})/2$--.

(3) In column 19, line 53, change "$d_2 = f_1 + f_2 + \Delta d, (\Delta d22\ 0)$" to
--$d_2 = f_1 + f_2 + \Delta d, (\Delta d > 0)$--.

(4) In claim 4, column 26, line 12, change "$\Delta_d > 0$" to --$\Delta d > 0$--.

(5) In claim 5, column 26, line 38, change "$-f_1^2 / (f_2 + \Delta d [<m]ed) < z_1 < f_1$" to
-- $-f_1^2 / (f_2 + \Delta d) < z_1 < f_1$--.

Signed and Sealed this

Thirty-first Day of March, 1998

Attest:

BRUCE LEHMAN

*Attesting Officer*   *Commissioner of Patents and Trademarks*